United States Patent
Ahn et al.

(10) Patent No.: US 7,410,910 B2
(45) Date of Patent: Aug. 12, 2008

(54) LANTHANUM ALUMINUM OXYNITRIDE DIELECTRIC FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/216,474

(22) Filed: Aug. 31, 2005

(65) Prior Publication Data

US 2007/0048926 A1    Mar. 1, 2007

(51) Int. Cl.
*H01L 21/31* (2006.01)
(52) U.S. Cl. ............... 438/761; 438/770; 257/E21.191
(58) Field of Classification Search ............... 438/437, 438/758, 761, 769, 770; 257/E21.191, E21.643
See application file for complete search history.

(56) References Cited

U.S. PATENT DOCUMENTS

| | | |
|---|---|---|
| 4,542,870 A | 9/1985 | Howell |
| 5,252,370 A | 10/1993 | Tominaga et al. |
| 5,334,433 A | 8/1994 | Tominaga |
| 5,364,708 A | 11/1994 | Tominaga |
| 5,401,609 A | 3/1995 | Haratani et al. |
| 5,406,546 A | 4/1995 | Uchiyama et al. |
| 5,418,030 A | 5/1995 | Tominaga et al. |
| 5,430,706 A | 7/1995 | Utsunomiya et al. |
| 5,439,524 A | 8/1995 | Cain et al. |
| 5,470,628 A | 11/1995 | Tominaga et al. |
| 5,498,507 A | 3/1996 | Handa et al. |
| 5,523,140 A | 6/1996 | Tominaga et al. |
| 5,552,237 A | 9/1996 | Utsunomiya et al. |
| 5,569,517 A | 10/1996 | Tominaga et al. |
| 5,577,020 A | 11/1996 | Utsunomiya et al. |
| 5,593,789 A | 1/1997 | Utsunomiya et al. |
| 5,620,766 A | 4/1997 | Uchiyama et al. |
| 5,627,012 A | 5/1997 | Tominaga et al. |
| 5,637,371 A | 6/1997 | Tominaga et al. |
| 5,637,372 A | 6/1997 | Tominaga et al. |
| 5,700,567 A | 12/1997 | Utsunomiya |
| 5,714,336 A | 2/1998 | Simons et al. |
| 5,714,766 A | 2/1998 | Chen et al. |
| 5,739,524 A | 4/1998 | Fally |

(Continued)

FOREIGN PATENT DOCUMENTS

WO    WO-2006026716 A1    3/2006

OTHER PUBLICATIONS

Xu-bing Lu et al., "Structure and dielectric properties of amorphous LaAlOsub3 and LaAlOsub x Nsub y films as alternative gate diectric materials", Journal of Applied Physics, vol. 94, No. 2, pp. 1229-1234.*

(Continued)

*Primary Examiner*—W. David Coleman
(74) *Attorney, Agent, or Firm*—Schwegman, Lundberg & Woessner, P.A.

(57) ABSTRACT

Electronic apparatus and methods of forming the electronic apparatus include a lanthanum aluminum oxynitride film on a substrate for use in a variety of electronic systems. The lanthanum aluminum oxynitride film may be structured as one or more monolayers. The lanthanum aluminum oxynitride film may be formed by atomic layer deposition.

58 Claims, 3 Drawing Sheets

U.S. PATENT DOCUMENTS

| | | | |
|---|---|---|---|
| 5,825,046 A | 10/1998 | Czubatyj et al. | |
| 5,891,542 A | 4/1999 | Tominaga et al. | |
| 5,906,874 A | 5/1999 | Takahashi et al. | |
| 5,923,056 A | 7/1999 | Lee et al. | |
| 5,958,140 A | 9/1999 | Arami et al. | |
| 5,965,323 A | 10/1999 | Takahashi et al. | |
| 5,981,014 A | 11/1999 | Tsukagoshi et al. | |
| 5,981,350 A | 11/1999 | Geusic et al. | |
| 6,002,418 A | 12/1999 | Yoneda et al. | |
| 6,025,225 A | 2/2000 | Forbes et al. | |
| 6,025,627 A | 2/2000 | Forbes et al. | |
| 6,030,679 A | 2/2000 | Saito et al. | |
| 6,040,030 A | 3/2000 | Utsunomiya et al. | |
| 6,051,363 A | 4/2000 | Utsunomiya et al. | |
| 6,061,077 A | 5/2000 | Kashiwaya et al. | |
| 6,063,705 A | 5/2000 | Vaartstra | |
| 6,081,287 A | 6/2000 | Noshita et al. | |
| 6,087,067 A | 7/2000 | Kato et al. | |
| 6,087,674 A | 7/2000 | Ovshinsky et al. | |
| 6,087,695 A | 7/2000 | Chen | |
| 6,090,636 A | 7/2000 | Geusic et al. | |
| 6,103,330 A | 8/2000 | Kosuda et al. | |
| 6,134,175 A | 10/2000 | Forbes et al. | |
| 6,136,168 A | 10/2000 | Masujima et al. | |
| 6,137,520 A | 10/2000 | Kashiwaya et al. | |
| 6,150,188 A | 11/2000 | Geusic et al. | |
| 6,153,355 A | 11/2000 | Takahashi et al. | |
| 6,162,712 A | 12/2000 | Baum et al. | |
| 6,175,377 B1 | 1/2001 | Noshita et al. | |
| 6,191,448 B1 | 2/2001 | Forbes et al. | |
| 6,194,237 B1 | 2/2001 | Kim et al. | |
| 6,198,168 B1 | 3/2001 | Geusic et al. | |
| 6,242,157 B1 | 6/2001 | Tominaga et al. | |
| 6,243,941 B1 | 6/2001 | Kashiwaya et al. | |
| 6,256,052 B1 | 7/2001 | Yoneda | |
| 6,256,053 B1 | 7/2001 | Noshita et al. | |
| 6,274,937 B1 | 8/2001 | Ahn et al. | |
| 6,281,042 B1 | 8/2001 | Ahn et al. | |
| 6,291,341 B1 | 9/2001 | Sharan et al. | |
| 6,294,813 B1 | 9/2001 | Forbes et al. | |
| 6,297,103 B1 | 10/2001 | Ahn et al. | |
| 6,316,054 B1 | 11/2001 | Kashiwaya et al. | |
| 6,317,357 B1 | 11/2001 | Forbes | |
| 6,329,036 B1 | 12/2001 | Kikukawa et al. | |
| 6,331,465 B1 | 12/2001 | Forbes et al. | |
| 6,337,704 B1 | 1/2002 | Yamaguchi | |
| 6,346,477 B1 | 2/2002 | Kaloyeros et al. | |
| 6,350,704 B1 | 2/2002 | Ahn et al. | |
| 6,351,276 B1 | 2/2002 | Yamaguchi | |
| 6,358,766 B1 | 3/2002 | Kasahara | |
| 6,381,168 B2 | 4/2002 | Forbes | |
| 6,392,257 B1 | 5/2002 | Ramdani et al. | |
| 6,395,650 B1 | 5/2002 | Callegari et al. | |
| 6,399,979 B1 | 6/2002 | Noble et al. | |
| 6,406,772 B2 | 6/2002 | Tominaga et al. | |
| 6,407,435 B1 | 6/2002 | Ma et al. | |
| 6,410,368 B1 | 6/2002 | Kawasaki et al. | |
| 6,418,050 B2 | 7/2002 | Forbes | |
| 6,426,245 B1 | 7/2002 | Kawasaki et al. | |
| 6,429,065 B2 | 8/2002 | Forbes | |
| 6,434,041 B2 | 8/2002 | Forbes et al. | |
| 6,452,229 B1 | 9/2002 | Krivokapic | |
| 6,454,912 B1 | 9/2002 | Ahn et al. | |
| 6,461,710 B1 | 10/2002 | Kikukawa et al. | |
| 6,465,298 B2 | 10/2002 | Forbes et al. | |
| 6,476,434 B1 | 11/2002 | Noble et al. | |
| 6,486,027 B1 | 11/2002 | Noble et al. | |
| 6,486,703 B2 | 11/2002 | Noble et al. | |
| 6,492,233 B2 | 12/2002 | Forbes et al. | |
| 6,492,659 B1 | 12/2002 | Yamazaki et al. | |
| 6,495,436 B2 | 12/2002 | Ahn et al. | |
| 6,498,065 B1 | 12/2002 | Forbes et al. | |
| 6,504,214 B1 | 1/2003 | Yu et al. | |
| 6,514,820 B2 | 2/2003 | Ahn et al. | |
| 6,514,828 B2 | 2/2003 | Ahn et al. | |
| 6,515,510 B2 | 2/2003 | Noble et al. | |
| 6,518,615 B1 | 2/2003 | Geusic et al. | |
| 6,526,191 B1 | 2/2003 | Geusic et al. | |
| 6,534,420 B2 | 3/2003 | Ahn et al. | |
| 6,537,721 B2 | 3/2003 | Inoue et al. | |
| 6,538,330 B1 | 3/2003 | Forbes | |
| 6,542,229 B1 | 4/2003 | Kalal et al. | |
| 6,544,846 B2 | 4/2003 | Ahn et al. | |
| 6,552,383 B2 | 4/2003 | Ahn et al. | |
| 6,555,875 B2 | 4/2003 | Kawasaki et al. | |
| 6,558,563 B2 | 5/2003 | Kashiwaya et al. | |
| 6,566,147 B2 | 5/2003 | Basceri et al. | |
| 6,570,248 B1 | 5/2003 | Ahn et al. | |
| 6,586,792 B2 | 7/2003 | Ahn et al. | |
| 6,586,797 B2 | 7/2003 | Forbes et al. | |
| 6,597,037 B1 | 7/2003 | Forbes et al. | |
| 6,599,788 B1 | 7/2003 | Kawasaki et al. | |
| 6,608,378 B2 | 8/2003 | Ahn et al. | |
| 6,624,013 B2 | 9/2003 | Kawasaki et al. | |
| 6,630,383 B1 | 10/2003 | Ibok et al. | |
| 6,653,657 B2 | 11/2003 | Kawasaki et al. | |
| 6,661,058 B2 | 12/2003 | Ahn et al. | |
| 6,674,167 B1 | 1/2004 | Ahn et al. | |
| 6,688,951 B2 | 2/2004 | Kashiwaya et al. | |
| 6,689,660 B1 | 2/2004 | Noble et al. | |
| 6,709,978 B2 | 3/2004 | Geusic et al. | |
| 6,710,538 B1 | 3/2004 | Ahn et al. | |
| 6,713,329 B1 | 3/2004 | Wagner et al. | |
| 6,720,221 B1 | 4/2004 | Ahn et al. | |
| 6,723,577 B1 | 4/2004 | Geusic et al. | |
| 6,731,590 B1 | 5/2004 | Shingai et al. | |
| 6,734,480 B2 | 5/2004 | Chung et al. | |
| 6,748,959 B1 | 6/2004 | Kashiwaya et al. | |
| 6,750,126 B1 | 6/2004 | Visokay et al. | |
| 6,753,567 B2 | 6/2004 | Maria et al. | |
| 6,754,108 B2 | 6/2004 | Forbes | |
| 6,756,292 B2 | 6/2004 | Lee et al. | |
| 6,756,298 B2 | 6/2004 | Ahn et al. | |
| 6,762,081 B2 | 7/2004 | Yamazaki et al. | |
| 6,764,901 B2 | 7/2004 | Noble | |
| 6,767,795 B2 | 7/2004 | Ahn et al. | |
| 6,770,923 B2 * | 8/2004 | Nguyen et al. | 257/295 |
| 6,774,050 B2 | 8/2004 | Ahn et al. | |
| 6,777,715 B1 | 8/2004 | Geusic et al. | |
| 6,778,441 B2 | 8/2004 | Forbes et al. | |
| 6,787,370 B2 | 9/2004 | Forbes | |
| 6,787,413 B2 | 9/2004 | Ahn | |
| 6,790,791 B2 | 9/2004 | Ahn et al. | |
| 6,794,709 B2 | 9/2004 | Ahn et al. | |
| 6,803,326 B2 | 10/2004 | Ahn et al. | |
| 6,804,136 B2 | 10/2004 | Forbes | |
| 6,809,370 B1 | 10/2004 | Colombo et al. | |
| 6,812,100 B2 | 11/2004 | Ahn et al. | |
| 6,812,157 B1 | 11/2004 | Gadgil | |
| 6,812,513 B2 | 11/2004 | Geusic et al. | |
| 6,812,516 B2 | 11/2004 | Noble, Jr. et al. | |
| 6,812,517 B2 | 11/2004 | Baker | |
| 6,818,067 B2 | 11/2004 | Doering et al. | |
| 6,818,937 B2 | 11/2004 | Noble et al. | |
| 6,833,285 B1 | 12/2004 | Ahn et al. | |
| 6,833,308 B2 | 12/2004 | Ahn et al. | |
| 6,835,111 B2 | 12/2004 | Ahn et al. | |
| 6,844,203 B2 | 1/2005 | Ahn et al. | |
| 6,844,249 B2 | 1/2005 | Kawasaki et al. | |
| 6,849,948 B2 | 2/2005 | Chen et al. | |
| 6,852,167 B2 | 2/2005 | Ahn | |
| 6,852,645 B2 * | 2/2005 | Colombo et al. | 438/770 |
| 6,858,120 B2 | 2/2005 | Ahn et al. | |
| 6,858,444 B2 | 2/2005 | Ahn et al. | |

| | | | | | | |
|---|---|---|---|---|---|---|
| 6,858,865 B2 | 2/2005 | Ahn et al. | 7,160,577 B2 | 1/2007 | Ahn et al. |
| 6,878,624 B1 | 4/2005 | Bruley et al. | 7,160,597 B2 | 1/2007 | Inoue et al. |
| 6,884,719 B2 | 4/2005 | Chang et al. | 7,160,817 B2 | 1/2007 | Marsh |
| 6,884,739 B2 | 4/2005 | Ahn et al. | 7,161,894 B2 | 1/2007 | Judge |
| 6,887,758 B2 | 5/2005 | Chindalore et al. | 7,166,347 B2 | 1/2007 | Inoue et al. |
| 6,888,739 B2 | 5/2005 | Forbes | 7,166,886 B2 | 1/2007 | Forbes |
| 6,893,984 B2 | 5/2005 | Ahn et al. | 7,167,440 B2 | 1/2007 | Inoue et al. |
| 6,900,122 B2 | 5/2005 | Ahn et al. | 7,169,673 B2 | 1/2007 | Ahn et al. |
| 6,909,156 B2 | 6/2005 | Aoyama | 7,176,076 B2 | 2/2007 | Chambers et al. |
| 6,914,800 B2 | 7/2005 | Ahn et al. | 7,182,990 B2 | 2/2007 | Inoue et al. |
| 6,919,266 B2 | 7/2005 | Ahn et al. | 7,183,186 B2 | 2/2007 | Ahn et al. |
| 6,921,702 B2 | 7/2005 | Ahn et al. | 7,187,587 B2 | 3/2007 | Forbes |
| 6,929,840 B2 | 8/2005 | Hosoda et al. | 7,192,824 B2 | 3/2007 | Ahn et al. |
| 6,930,346 B2 | 8/2005 | Ahn et al. | 7,192,892 B2 | 3/2007 | Ahn et al. |
| 6,936,508 B2 | 8/2005 | Visokay et al. | 7,199,023 B2 | 4/2007 | Ahn et al. |
| 6,953,730 B2 | 10/2005 | Ahn et al. | 7,202,562 B2 | 4/2007 | Farrar |
| 6,955,968 B2 | 10/2005 | Forbes et al. | 7,205,218 B2 | 4/2007 | Ahn et al. |
| 6,958,302 B2 | 10/2005 | Ahn et al. | 7,208,793 B2 | 4/2007 | Bhattacharyya |
| 6,958,937 B2 | 10/2005 | Forbes et al. | 7,214,416 B2 | 5/2007 | Nakai et al. |
| 6,960,538 B2 | 11/2005 | Ahn et al. | 7,221,017 B2 | 5/2007 | Forbes et al. |
| 6,963,103 B2 | 11/2005 | Forbes | 7,221,586 B2 | 5/2007 | Forbes et al. |
| 6,967,154 B2 | 11/2005 | Meng et al. | 7,226,830 B2 | 6/2007 | Colombo et al. |
| 6,970,053 B2 | 11/2005 | Akram et al. | 7,235,501 B2 | 6/2007 | Ahn et al. |
| 6,979,623 B2 | 12/2005 | Rotondaro et al. | 7,235,854 B2 | 6/2007 | Ahn et al. |
| 6,979,855 B2 | 12/2005 | Ahn et al. | 7,250,338 B2 | 7/2007 | Bhattacharyya |
| 6,982,230 B2 | 1/2006 | Cabral, Jr., et al. | 7,274,067 B2 | 9/2007 | Forbes |
| 6,989,573 B2 | 1/2006 | Ahn et al. | 7,291,526 B2 | 11/2007 | Li |
| 6,995,437 B1 | 2/2006 | Kinoshita et al. | 7,297,617 B2 | 11/2007 | Farrar et al. |
| 7,012,297 B2 | 3/2006 | Bhattacharyya | 7,301,221 B2 | 11/2007 | Farrar et al. |
| 7,014,903 B2 | 3/2006 | Takasaki et al. | 7,312,494 B2 | 12/2007 | Ahn et al. |
| 7,015,534 B2 | 3/2006 | Colombo | 7,326,980 B2 | 2/2008 | Ahn et al. |
| 7,018,694 B2 | 3/2006 | Hosoda et al. | 2001/0005625 A1 | 6/2001 | Sun et al. |
| 7,018,695 B2 | 3/2006 | Kakiuchi et al. | 2001/0012698 A1 | 8/2001 | Hayashi et al. |
| 7,018,868 B1 | 3/2006 | Yang et al. | 2001/0015441 A1 | 8/2001 | Kawasaki et al. |
| 7,026,694 B2 | 4/2006 | Ahn et al. | 2001/0019876 A1 | 9/2001 | Juengling et al. |
| 7,037,574 B2 | 5/2006 | Paranjpe et al. | 2001/0024387 A1 | 9/2001 | Raaijmakers et al. |
| 7,037,862 B2 | 5/2006 | Ahn et al. | 2001/0031332 A1 | 10/2001 | Tominaga et al. |
| 7,042,043 B2 | 5/2006 | Forbes et al. | 2001/0032995 A1 | 10/2001 | Maria et al. |
| 7,045,205 B1 | 5/2006 | Sager | 2001/0034117 A1 | 10/2001 | Eldridge et al. |
| 7,045,430 B2 | 5/2006 | Ahn et al. | 2001/0050438 A1 | 12/2001 | Juengling et al. |
| 7,045,431 B2 | 5/2006 | Rotondaro et al. | 2001/0054598 A1 | 12/2001 | Kashiwaya et al. |
| 7,049,192 B2 | 5/2006 | Ahn et al. | 2002/0004276 A1 | 1/2002 | Ahn et al. |
| 7,064,048 B2 | 6/2006 | Lai et al. | 2002/0004277 A1 | 1/2002 | Ahn et al. |
| 7,064,058 B2 | 6/2006 | Ahn et al. | 2002/0013052 A1 | 1/2002 | Visokay |
| 7,071,066 B2 | 7/2006 | Wang et al. | 2002/0019125 A1 | 2/2002 | Juengling et al. |
| 7,074,673 B2 | 7/2006 | Forbes | 2002/0024080 A1 | 2/2002 | Derderian et al. |
| 7,075,829 B2 | 7/2006 | Forbes | 2002/0025628 A1 | 2/2002 | Derderian et al. |
| 7,081,421 B2 | 7/2006 | Ahn et al. | 2002/0037603 A1 | 3/2002 | Eldridge et al. |
| 7,084,078 B2 | 8/2006 | Ahn et al. | 2002/0046705 A1 | 4/2002 | Sandhu et al. |
| 7,087,954 B2 | 8/2006 | Forbes | 2002/0053869 A1 | 5/2002 | Ahn et al. |
| 7,091,119 B2 | 8/2006 | Colombo | 2002/0086521 A1 | 7/2002 | Ahn et al. |
| 7,101,813 B2 | 9/2006 | Ahn et al. | 2002/0086555 A1 | 7/2002 | Ahn et al. |
| 7,112,841 B2 | 9/2006 | Eldridge et al. | 2002/0089063 A1 | 7/2002 | Ahn et al. |
| 7,115,530 B2 | 10/2006 | Quevedo-Lopez et al. | 2002/0090806 A1 | 7/2002 | Ahn et al. |
| 7,122,409 B2 | 10/2006 | Kawasaki et al. | 2002/0100418 A1 | 8/2002 | Sandhu et al. |
| 7,122,464 B2 | 10/2006 | Vaartstra | 2002/0102818 A1 | 8/2002 | Sandhu et al. |
| 7,126,183 B2 | 10/2006 | Forbes et al. | 2002/0110991 A1 | 8/2002 | Li |
| 7,129,553 B2 | 10/2006 | Ahn et al. | 2002/0111001 A1 | 8/2002 | Ahn |
| 7,132,329 B1 | 11/2006 | Hong et al. | 2002/0117704 A1 | 8/2002 | Gonzalez |
| 7,135,361 B2 | 11/2006 | Visokay et al. | 2002/0121665 A1 | 9/2002 | Kawasaki et al. |
| 7,135,369 B2 | 11/2006 | Ahn et al. | 2002/0122885 A1 | 9/2002 | Ahn |
| 7,135,370 B2 | 11/2006 | Baker | 2002/0130338 A1 | 9/2002 | Ahn et al. |
| 7,135,421 B2 | 11/2006 | Ahn et al. | 2002/0132374 A1 | 9/2002 | Basceri et al. |
| 7,135,734 B2 | 11/2006 | Eldridge et al. | 2002/0135048 A1 | 9/2002 | Ahn et al. |
| 7,136,343 B2 | 11/2006 | Inoue et al. | 2002/0146874 A1 | 10/2002 | Kawasaki et al. |
| 7,138,336 B2 | 11/2006 | Lee et al. | 2002/0155688 A1 | 10/2002 | Ahn et al. |
| 7,141,288 B2 | 11/2006 | Inoue et al. | 2002/0155689 A1 | 10/2002 | Ahn et al. |
| 7,141,289 B2 | 11/2006 | Inoue et al. | 2002/0164420 A1 | 11/2002 | Derderian et al. |
| 7,144,825 B2 | 12/2006 | Adetutu et al. | 2002/0167057 A1 | 11/2002 | Ahn et al. |
| 7,148,546 B2 | 12/2006 | Visokay et al. | 2002/0167089 A1 | 11/2002 | Ahn et al. |
| 7,154,354 B2 | 12/2006 | Akram et al. | 2002/0170671 A1 | 11/2002 | Matsuhita et al. |
| 7,154,836 B2 | 12/2006 | Inoue et al. | 2002/0177244 A1 | 11/2002 | Hsu et al. |
| 7,157,128 B2 | 1/2007 | Inoue et al. | 2002/0192974 A1 | 12/2002 | Ahn et al. |

| | | | | | | |
|---|---|---|---|---|---|---|
| 2002/0192975 A1 | 12/2002 | Ahn | | 2004/0159863 A1 | 8/2004 | Eldridge et al. |
| 2002/0192979 A1 | 12/2002 | Ahn | | 2004/0161883 A1 | 8/2004 | Colombo et al. |
| 2002/0195056 A1 | 12/2002 | Sandhu et al. | | 2004/0164357 A1 | 8/2004 | Ahn et al. |
| 2002/0197793 A1 | 12/2002 | Dornfest et al. | | 2004/0164365 A1 | 8/2004 | Ahn et al. |
| 2002/0197881 A1 | 12/2002 | Ramdani et al. | | 2004/0169453 A1 | 9/2004 | Ahn et al. |
| 2003/0001190 A1 | 1/2003 | Basceri et al. | | 2004/0174804 A1 | 9/2004 | Kakiuchi et al. |
| 2003/0003702 A1 | 1/2003 | Ahn | | 2004/0175882 A1 | 9/2004 | Ahn et al. |
| 2003/0003722 A1 | 1/2003 | Vaartstra | | 2004/0178439 A1 | 9/2004 | Ahn et al. |
| 2003/0003730 A1 | 1/2003 | Li | | 2004/0180171 A1 | 9/2004 | Takasaki et al. |
| 2003/0008235 A1 | 1/2003 | Inoue et al. | | 2004/0183108 A1 | 9/2004 | Ahn |
| 2003/0008243 A1 | 1/2003 | Ahn et al. | | 2004/0185654 A1 | 9/2004 | Ahn |
| 2003/0016619 A1 | 1/2003 | Judge et al. | | 2004/0188778 A1 | 9/2004 | Aoyama |
| 2003/0017717 A1 | 1/2003 | Ahn et al. | | 2004/0189175 A1 | 9/2004 | Ahn et al. |
| 2003/0020169 A1 | 1/2003 | Ahn et al. | | 2004/0190435 A1 | 9/2004 | Hosoda et al. |
| 2003/0020180 A1 | 1/2003 | Ahn et al. | | 2004/0191462 A1 | 9/2004 | Hosoda et al. |
| 2003/0027360 A1 | 2/2003 | Hsu et al. | | 2004/0191685 A1 | 9/2004 | Kakiuchi et al. |
| 2003/0042527 A1 | 3/2003 | Forbes et al. | | 2004/0191687 A1 | 9/2004 | Fukuzawa et al. |
| 2003/0043633 A1 | 3/2003 | Forbes et al. | | 2004/0191689 A1 | 9/2004 | Shingai et al. |
| 2003/0043637 A1 | 3/2003 | Forbes et al. | | 2004/0208105 A1 | 10/2004 | Shingai et al. |
| 2003/0045060 A1 | 3/2003 | Ahn et al. | | 2004/0213124 A1 | 10/2004 | Shingai et al. |
| 2003/0045078 A1 | 3/2003 | Ahn et al. | | 2004/0214399 A1 | 10/2004 | Ahn et al. |
| 2003/0045082 A1 | 3/2003 | Eldridge et al. | | 2004/0219783 A1 | 11/2004 | Ahn et al. |
| 2003/0048666 A1 | 3/2003 | Eldridge et al. | | 2004/0222476 A1 | 11/2004 | Ahn et al. |
| 2003/0049900 A1 | 3/2003 | Forbes et al. | | 2004/0233010 A1 | 11/2004 | Akram et al. |
| 2003/0060146 A1 | 3/2003 | Kashiwaya et al. | | 2004/0238904 A1 | 12/2004 | Colombo et al. |
| 2003/0092213 A1 | 5/2003 | Yamazaki et al. | | 2004/0241581 A1 | 12/2004 | Kakiuchi et al. |
| 2003/0106490 A1 | 6/2003 | Jallepally et al. | | 2004/0248387 A1 | 12/2004 | Kawasaki et al. |
| 2003/0111678 A1 | 6/2003 | Colombo et al. | | 2004/0248398 A1 | 12/2004 | Ahn et al. |
| 2003/0119246 A1 | 6/2003 | Ahn | | 2004/0262700 A1 | 12/2004 | Ahn et al. |
| 2003/0119291 A1 | 6/2003 | Ahn et al. | | 2005/0009335 A1 | 1/2005 | Dean et al. |
| 2003/0132491 A1 | 7/2003 | Ahn | | 2005/0009370 A1 | 1/2005 | Ahn |
| 2003/0136995 A1 | 7/2003 | Geusic et al. | | 2005/0018590 A1 | 1/2005 | Inoue et al. |
| 2003/0137019 A1 | 7/2003 | Maria et al. | | 2005/0018591 A1 | 1/2005 | Inoue et al. |
| 2003/0139039 A1 | 7/2003 | Ahn et al. | | 2005/0018592 A1 | 1/2005 | Inoue et al. |
| 2003/0141560 A1 | 7/2003 | Sun | | 2005/0020017 A1 | 1/2005 | Ahn et al. |
| 2003/0143801 A1 | 7/2003 | Basceri et al. | | 2005/0023574 A1 | 2/2005 | Forbes et al. |
| 2003/0157764 A1 | 8/2003 | Ahn et al. | | 2005/0023594 A1 | 2/2005 | Ahn et al. |
| 2003/0172872 A1 | 9/2003 | Thakur et al. | | 2005/0023595 A1 | 2/2005 | Forbes et al. |
| 2003/0205774 A1 | 11/2003 | Hokazono | | 2005/0023602 A1 | 2/2005 | Forbes et al. |
| 2003/0207032 A1 | 11/2003 | Ahn et al. | | 2005/0023603 A1 | 2/2005 | Eldridge et al. |
| 2003/0207540 A1 | 11/2003 | Ahn et al. | | 2005/0023624 A1 | 2/2005 | Ahn et al. |
| 2003/0207564 A1 | 11/2003 | Ahn et al. | | 2005/0023625 A1 | 2/2005 | Ahn et al. |
| 2003/0227033 A1 | 12/2003 | Ahn et al. | | 2005/0023626 A1 | 2/2005 | Ahn et al. |
| 2003/0228747 A1 | 12/2003 | Ahn et al. | | 2005/0023627 A1 | 2/2005 | Ahn et al. |
| 2003/0235134 A1 | 12/2003 | Inoue et al. | | 2005/0024092 A1 | 2/2005 | Forbes |
| 2004/0004244 A1 | 1/2004 | Ahn et al. | | 2005/0026349 A1 | 2/2005 | Forbes et al. |
| 2004/0004245 A1 | 1/2004 | Forbes et al. | | 2005/0026360 A1 | 2/2005 | Geusic et al. |
| 2004/0004247 A1 | 1/2004 | Forbes | | 2005/0026374 A1 | 2/2005 | Ahn et al. |
| 2004/0004859 A1 | 1/2004 | Forbes | | 2005/0029547 A1 | 2/2005 | Ahn et al. |
| 2004/0016944 A1 | 1/2004 | Ahn et al. | | 2005/0029604 A1 | 2/2005 | Ahn et al. |
| 2004/0023461 A1 | 2/2004 | Ahn et al. | | 2005/0029605 A1 | 2/2005 | Ahn et al. |
| 2004/0027966 A1 | 2/2004 | Inoue et al. | | 2005/0030825 A1 | 2/2005 | Ahn |
| 2004/0032812 A1 | 2/2004 | Inoue et al. | | 2005/0032292 A1 | 2/2005 | Ahn et al. |
| 2004/0033681 A1 | 2/2004 | Ahn et al. | | 2005/0032342 A1 | 2/2005 | Forbes et al. |
| 2004/0033701 A1 | 2/2004 | Ahn et al. | | 2005/0034662 A1 | 2/2005 | Ahn |
| 2004/0036129 A1 | 2/2004 | Forbes et al. | | 2005/0037563 A1 | 2/2005 | Ahn |
| 2004/0038554 A1 | 2/2004 | Ahn | | 2005/0040034 A1 | 2/2005 | Landgraf et al. |
| 2004/0041192 A1 | 3/2004 | Baker | | 2005/0047301 A1 | 3/2005 | Inoue et al. |
| 2004/0041591 A1 | 3/2004 | Forbes | | 2005/0047302 A1 | 3/2005 | Inoue et al. |
| 2004/0043541 A1 | 3/2004 | Ahn | | 2005/0047303 A1 | 3/2005 | Inoue et al. |
| 2004/0043569 A1 | 3/2004 | Ahn | | 2005/0047304 A1 | 3/2005 | Inoue et al. |
| 2004/0086897 A1 | 5/2004 | Mirkin et al. | | 2005/0047305 A1 | 3/2005 | Inoue et al. |
| 2004/0092061 A1 | 5/2004 | Kawasaki et al. | | 2005/0047306 A1 | 3/2005 | Inoue et al. |
| 2004/0110348 A1 | 6/2004 | Ahn et al. | | 2005/0048249 A1 | 3/2005 | Inoue et al. |
| 2004/0110391 A1 | 6/2004 | Ahn et al. | | 2005/0051828 A1 | 3/2005 | Park et al. |
| 2004/0126944 A1 | 7/2004 | Pacheco Rotondaro et al. | | 2005/0054165 A1 | 3/2005 | Ahn et al. |
| 2004/0127003 A1 | 7/2004 | Chambers | | 2005/0059198 A1 | 3/2005 | Visokay et al. |
| 2004/0140470 A1 | 7/2004 | Kawasaki et al. | | 2005/0070062 A1 | 3/2005 | Visokay et al. |
| 2004/0140513 A1 | 7/2004 | Forbes et al. | | 2005/0070098 A1 | 3/2005 | Bruley |
| 2004/0144980 A1 | 7/2004 | Ahn et al. | | 2005/0077519 A1 | 4/2005 | Ahn et al. |
| 2004/0146805 A1 | 7/2004 | Kato et al. | | 2005/0079696 A1 | 4/2005 | Colombo |
| 2004/0156578 A1 | 8/2004 | Geusic et al. | | 2005/0087134 A1 | 4/2005 | Ahn |
| 2004/0157158 A1 | 8/2004 | Kakiuchi et al. | | 2005/0106797 A1 | 5/2005 | Colombo |

| | | |
|---|---|---|
| 2005/0112499 A1 | 5/2005 | Nakai et al. |
| 2005/0124174 A1 | 6/2005 | Ahn et al. |
| 2005/0124175 A1 | 6/2005 | Ahn et al. |
| 2005/0130442 A1 | 6/2005 | Visokay et al. |
| 2005/0136589 A1 | 6/2005 | Rotondaro et al. |
| 2005/0136632 A1 | 6/2005 | Rotondaro et al. |
| 2005/0138262 A1 | 6/2005 | Forbes |
| 2005/0140462 A1 | 6/2005 | Akram et al. |
| 2005/0142324 A1 | 6/2005 | Hayashida et al. |
| 2005/0145957 A1 | 7/2005 | Ahn et al. |
| 2005/0145969 A1 | 7/2005 | Forbes |
| 2005/0158973 A1 | 7/2005 | Ahn et al. |
| 2005/0164521 A1 | 7/2005 | Ahn et al. |
| 2005/0169054 A1 | 8/2005 | Forbes |
| 2005/0170208 A1 | 8/2005 | Yatsunami et al. |
| 2005/0181607 A1 | 8/2005 | Aoyama |
| 2005/0207308 A1 | 9/2005 | Kobayashi et al. |
| 2005/0215015 A1 | 9/2005 | Ahn et al. |
| 2005/0217722 A1 | 10/2005 | Komatsu et al. |
| 2005/0218462 A1 | 10/2005 | Ahn et al. |
| 2005/0227442 A1 | 10/2005 | Ahn et al. |
| 2005/0233247 A1 | 10/2005 | Hosoda et al. |
| 2005/0243677 A1 | 11/2005 | Kobayashi et al. |
| 2005/0263756 A1 | 12/2005 | Yatsunami et al. |
| 2005/0270963 A1 | 12/2005 | Mishima et al. |
| 2005/0277256 A1 | 12/2005 | Ahn et al. |
| 2005/0280067 A1 | 12/2005 | Ahn et al. |
| 2005/0285225 A1 | 12/2005 | Ahn et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0003529 A1 | 1/2006 | Baker |
| 2006/0008966 A1 | 1/2006 | Forbes et al. |
| 2006/0024975 A1 | 2/2006 | Ahn et al. |
| 2006/0033165 A1 | 2/2006 | Chan et al. |
| 2006/0043367 A1 | 3/2006 | Chang et al. |
| 2006/0043492 A1 | 3/2006 | Ahn et al. |
| 2006/0043504 A1 | 3/2006 | Ahn et al. |
| 2006/0046383 A1 | 3/2006 | Chen et al. |
| 2006/0046505 A1 | 3/2006 | Ahn et al. |
| 2006/0046522 A1 | 3/2006 | Ahn et al. |
| 2006/0084247 A1 | 4/2006 | Liu |
| 2006/0105523 A1 | 5/2006 | Afzali-Ardakani et al. |
| 2006/0110870 A1 | 5/2006 | Bhattacharyya |
| 2006/0118853 A1 | 6/2006 | Takata et al. |
| 2006/0118890 A1 | 6/2006 | Li |
| 2006/0121744 A1 | 6/2006 | Quevedo-Lopez et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0153051 A1 | 7/2006 | Kikukawa et al. |
| 2006/0161942 A1 | 7/2006 | Kikukawa et al. |
| 2006/0170032 A1 | 8/2006 | Bhattacharyya |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0186458 A1 | 8/2006 | Forbes et al. |
| 2006/0189154 A1 | 8/2006 | Ahn et al. |
| 2006/0194438 A1 | 8/2006 | Rao et al. |
| 2006/0205132 A1 | 9/2006 | Bhattacharyya |
| 2006/0223248 A1 | 10/2006 | Venugopal et al. |
| 2006/0223337 A1 | 10/2006 | Ahn et al. |
| 2006/0228868 A1 | 10/2006 | Ahn et al. |
| 2006/0231889 A1 | 10/2006 | Chen et al. |
| 2006/0237764 A1 | 10/2006 | Ahn et al. |
| 2006/0244045 A1 | 11/2006 | Visokay et al. |
| 2006/0244082 A1 | 11/2006 | Ahn et al. |
| 2006/0244100 A1 | 11/2006 | Ahn et al. |
| 2006/0245339 A1 | 11/2006 | Fukuzawa et al. |
| 2006/0246647 A1 | 11/2006 | Visokay et al. |
| 2006/0246651 A1 | 11/2006 | Chambers et al. |
| 2006/0246716 A1 | 11/2006 | Colombo et al. |
| 2006/0246741 A1 | 11/2006 | Ahn et al. |
| 2006/0252211 A1 | 11/2006 | Ahn et al. |
| 2006/0255470 A1 | 11/2006 | Ahn et al. |
| 2006/0258097 A1 | 11/2006 | Forbes et al. |
| 2006/0261376 A1 | 11/2006 | Forbes et al. |
| 2006/0261397 A1 | 11/2006 | Ahn et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0267113 A1 | 11/2006 | Tobin et al. |
| 2006/0270147 A1 | 11/2006 | Ahn et al. |
| 2006/0274580 A1 | 12/2006 | Forbes |
| 2006/0275577 A1 | 12/2006 | Nakai et al. |
| 2006/0280895 A1 | 12/2006 | Kikukawa et al. |
| 2006/0280896 A1 | 12/2006 | Kikukawa et al. |
| 2006/0281330 A1 | 12/2006 | Ahn et al. |
| 2006/0292773 A1 | 12/2006 | Goolsby et al. |
| 2007/0007560 A1 | 1/2007 | Forbes et al. |
| 2007/0018214 A1 | 1/2007 | Ahn |
| 2007/0020835 A1 | 1/2007 | Ahn et al. |
| 2007/0030795 A1 | 2/2007 | Kikuawa et al. |
| 2007/0037335 A1 | 2/2007 | Chambers et al. |
| 2007/0037415 A1 | 2/2007 | Ahn et al. |
| 2007/0048926 A1 | 3/2007 | Ahn |
| 2007/0049051 A1 | 3/2007 | Ahn et al. |
| 2007/0049054 A1 | 3/2007 | Ahn et al. |
| 2007/0059872 A1 | 3/2007 | Visokay et al. |
| 2007/0059881 A1 | 3/2007 | Ahn et al. |
| 2007/0069241 A1 | 3/2007 | Yang et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0105313 A1 | 5/2007 | Forbes |
| 2007/0111544 A1 | 5/2007 | Ahn |
| 2007/0134931 A1 | 6/2007 | Ahn et al. |
| 2007/0134942 A1 | 6/2007 | Ahn et al. |
| 2007/0145454 A1 | 6/2007 | Bhattacharyya |
| 2007/0158765 A1 | 7/2007 | Ahn et al. |
| 2007/0178643 A1 | 8/2007 | Forbes et al. |
| 2007/0181931 A1 | 8/2007 | Ahn et al. |

OTHER PUBLICATIONS

Ahn, Kie Y., et al., "ALD of Atomorphous Lanthanide Doped TIOX Films", U.S. Appl. No. 11/092,072; filed Mar. 29, 2005.

Ahn, Kie Y., et al., "Atomic Layer Deposited Hafnium Tantalum Oxide Dielectrics", U.S. Appl. No. 11/029,757; filed Jan. 5, 2005.

Ahn, Kie Y., et al., "Atomic Layer Deposited Lanthanum Aluminum Oxide Dielectric Layer", U.S. Appl. No. 10/930,167; filed Aug. 31, 2004.

Ahn, Kie Y., et al., "Atomic Layer Deposited Lanthanum Hafnium Oxide Dielectrics", U.S. Appl. No. 10/010,529; filed Dec. 13, 2004.

Ahn, Kie Y., et al., "Atomic Layer Deposited Titanium Aluminum Oxide Films", U.S. Appl. No. 10/931,533; filed Aug. 31, 2004.

Ahn, Kie Y., et al., "Atomic Layer Deposited Titanium Silicon Oxide Films", U.S. Appl. No. 10/093,104; filed Mar. 29, 2005.

Ahn, Kie Y., et al., "Atomic Layer Deposited Zirconium Silicon Oxide Films", U.S. Appl. No. 10/117,121; filed Apr. 28, 2005.

Ahn, Kie Y., et al., "Atomic Layer Deposition of a Ruthenium Layer to a Lanthanide Oxide Dielectric Layer", U.S. Appl. No. 10/117,125; filed Apr. 28, 2005.

Ahn, Kie Y., et al., "Atomic Layer Deposition of CEO2/AL2O3 Films As Gate Dielectrics", U.S. Appl. No. 10/055,380; filed Feb. 10, 2005.

Ahn, Kie Y., et al., "Atomic Layer Deposition of DY-Doped HFO2 Films As Gate Dielectrics", U.S. Appl. No. 11/053,577; filed Feb. 8, 2005.

Ahn, Kie Y., et al., "Atomic Layer Deposition of HF3N4/HFO2 Films As Gate Dielectrics", U.S. Appl. No. 11/063,717; filed Feb. 23, 2005.

Ahn, Kie Y., et al., "Atomic Layer Deposition of Zirconium-Doped Tantalum Oxide Films", U.S. Appl. No. 11/909,959; filed Aug. 2, 2004.

Ahn, Kie Y., et al., "Atomic Layer Deposition of Zr3N4/ZrO2 Films As Gate Dielectrics", U.S. Appl. No. 11/058,563; filed Feb. 15, 2005.

Ahn, Kie Y., et al., "Atomic Layer Deposition of ZRC HFY SN1-X-Y O2 Films As High K Gate Dielectrics", U.S. Appl. No. 11/215,530, filed Aug. 29, 2005.

Ahn, Kie Y., et al., "Hafnium Tatanium Oxide Films", U.S. Appl. No. 11/140,643; filed May 27, 2005.

Ahn, Kie Y., et al., "Hybrid ALD-CVD of PrXOY/ZrO2 Films As Gate Dielectrics", U.S. Appl. No. 11/010,766; filed Dec. 13, 2004.

Ahn, Kie Y., et al., "Iridium / Zirconium Oxide Structure", U.S. Appl. No. 11/152,759; filed Jun. 14, 2005.

Ahn, Kie Y., et al., "Magnesium Titanium Oxide Films", U.S. Appl. No. 11/189,075; filed Jul. 25, 2005.

Ahn, Kie Y., et al., "Ruthenium Gate for a Lanthanide Oxide Dielectric Layer", U.S. Appl. No. 11/926,812; filed Aug. 26, 2004.

Ahn, Kie Y., et al., "Semiconductor Constructions Comprising Cerium Oxide and Titanium Oxide; and Methods of Forming Semiconductor Constructions", U.S. Appl. No. 11/881,874; filed Jun. 29, 2004.

Leskela, M., et al., "ALD precursor chemistry: Evolution and future challenges", *J. Phys. IV France*, 9, (1999),837-852.

Suntola, T., "Atomic Layer Epitaxy", *Handbook of Crystal Growth, 3: Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Wilk, G. D., et al., "High-K gate dielectrics: Current status and materials properties considerations", *Journal of Applied Physics*, 89(10), (May 2001),5243-5275.

Ahn, "Atomic Layer Deposited Dielectric Layers", U.S. Appl. No. 10/379,470, filed Mar. 4, 2003.

Ahn, Kie Y., "Cobalt Titanium Oxide Dielectric Films", U.S. Appl. No. 11/216,958, filed Aug. 31, 2005.

Ahn, "Conductive Nanoparticles", U.S. Appl. No. 11/197,184, filed Aug. 4, 2005.

Ahn Kie Y., "Gallium Lanthanide Oxide Films", U.S. Appl. No. 11/329,025, filed Jun. 14, 2005.

Ahn, "Iridium / Zirconium Oxide Structure", U.S. Appl. No. 11/152,759, filed Jun. 14, 2005.

Ahn, Kie Y., "Lanthanide Yttrium Aluminum Oxide Dielectric Films", U.S. Appl. No. 11/297,567, filed Dec. 8, 2005.

Ahn Kie Y., "Zirconium-Doped Gadolinium Oxide Films", U.S. Appl. No. 11/215,578, filed Aug. 29, 2005.

Forbes, et al., "Metal Substituted Transistor Gates", U.S, Appl. No. 11/176,738, filed Jul. 7, 2005.

Forbes, et al., "Metal Substituted Transistor Gates", U.S, Appl. No. 11/445,000, filed Jun. 1, 2006.

U.S. Appl. No. 10/137,058, filed May 2, 2002, Atomic Layer Deposition and Conversion.

U.S. Appl. No. 10/219,878, filed Aug. 15, 2002, Lanthanide Doped TiOx Dielectric Films.

U.S. Appl. No. 10/789,044, filed Feb. 27, 2004, Lanthanide Doped TiOx Dielectric Films.

U.S. Appl. No. 10/929,272, filed Aug. 30, 2004, Atomic Layer Deposition and Conversion.

U.S. Appl. No. 11/001,930, filed Dec. 2, 2004, Integrated Circuit Cooling System and Method.

U.S. Appl. No. 10/443,021, filed May 22, 2003, Atomic Layer Deposition (ALD).

U.S. Appl. No. 11/063,132, filed Feb. 22, 2005, High Permeability Layered Magnetic Films to Reduce Noise in High Speed Interconnection (As Amended).

U.S. Appl. No. 11/216,542, filed Aug. 30, 2005, Graded Dielectric Layers.

U.S. Appl. No. 11/197,184, filed Aug. 4, 2005, Conductive Nanoparticles.

U.S. Appl. No. 11/216,958, filed Aug. 31, 2005, Cobalt Titanium Oxide Dielectric Films.

U.S. Appl. No. 11/459,792, filed Jul. 25, 2006, ZrAlxOy Dielectric Layers.

U.S. Appl. No. 10/297,567, filed Dec. 8, 2005, Lanthanide Yttrium Aluminum Oxide Dielectric Films.

U.S. Appl. No. 11/297,741, filed Dec. 8, 2005, Hafnium Tantalum Titanium Oxide Films.

U.S. Appl. No. 11/329,025, filed Jan. 10, 2006, Gallium Lanthanide Oxide Films.

U.S. Appl. No. 11/514,655, filed Aug. 31, 2006, Tantalum Aluminum Oxynitride High-K Dielectric and Metal Gates.

U.S. Appl. No. 11/514,533, filed Aug. 31, 2006, Silicon Lanthanide Oxynitride Films.

U.S. Appl. No. 11/515,143, filed Aug. 31, 2006, Hafnium Lanthanide Oxynitride Films.

U.S. Appl. No. 11/514,601, filed Aug. 31, 2006, Tantalum Silicon Oxynitride High-K Dielectrics and Metal Gates.

U.S. Appl. No. 11/514,545, filed Aug. 31, 2006, Tantalum Lanthanide Oxynitride Films.

U.S. Appl. No. 11/515,114, filed Aug. 31, 2006, Hafnium Tantalum Oxynitride High-K Dielectric and Metal Gates.

U.S. Appl. No. 11/514,558, filed Aug. 31, 2006, Hafnium Aluminum Oxynitride High-K Dielectric and Metal Gates.

U.S. Appl. No. 11/427,569, filed Jun. 29, 2006, Lanthanide Doped TiOX Dielectric Films.

U.S. Appl. No. 11/493,074, filed Jul. 26, 2006, Lanthanide Oxide / Hafnium Oxide Dielectric Layers.

U.S. Appl. No. 11/493,112, filed Jul. 26, 2006, Zirconium-Doped Tantalum Oxide Films.

U.S. Appl. No. 11/457,978, filed Jul. 17, 2006, Atomic Layer Deposited Nanolaminates of HfO2/ZrO2 Films As Gate Dielectrics.

U.S. Appl. No. 11/457,987, filed Jul. 17, 2006, Atomic Layer Deposited Nanolaminates of Hf O2/ZrO2 Films As Gate Dielectrics.

U.S. Appl. No. 11/460,203, filed Jul. 26, 2006, Atomic Layer Deposition of Zr3N4/ZrO2 Films As Gate Dielectrics.

U.S. Appl. No. 11/529,157, filed Sep. 28, 2006, Integrated Circuit Cooling System and Method.

U.S. Appl. No. 11/528,776, filed Sep. 28, 2006, Atomic Layer Deposition of Ce02/Al2O3 Films as Gate Dielectrics.

"International Technology Roadmap for Semiconductors, 2001 Edition", Retrieved from http://public.itrs.net/Filed/2001/ITRS/Home.html, Organized by International SEMATCH, (2001), 469 pages.

Cho, Sung-Lae, "Metallorganic Chemical Vapor Deposition of TaOxNy as a High-Dielectric-Constant Material for Next-Gerneration Devices", *Journal of the Electrochemical Society*, 149(10), (Sep. 12, 2002), C529-C537.

Choi, Sangmoo, "High-k Gate Dielectric Prepared by Low-Temperature Wet Oxidation of Ultrathin Metal Nitride Directly Deposited on Silicon", *Jpn. J. Appl. Phys.*, vol. 42, (2003), L102-L104.

Desbiens, E., "Growth if high-k silicon oxynitride tin films by means of a pulsed laser deposition-atomic nitrogen plasma source hybrid system for gate dielectric applications", *Journal of Applied Physics*, vol. 94, No. 9, (Nov. 1, 2003), 5969-5975.

Desbiens, E., "Reactive pulsed laser deposition of high-k silicon dioxide and silicon oxynitride thin films for gate-dielectric applications", *J. Vac. Sci. Technol.* A 20(3), (May/Jun. 2002), 1157-1161.

Jeon, Sanghun, "Electrical characteristics of ZrOxNy prepared by NH3 annealing of ZrO2", *Applied Physics Letters*, vol. 79, No. 2, (Jul. 9, 2001), 245-247.

Jeong, Chang-Wook, "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001), 285-289.

Jung, Hyungsuk, "Electrical and Reliability Characteristics of an Ultrathin TaOxNy Gate Dielectric Prepared by O3 Annealing", *Jpn. J. Appl. Phys.* Col. 40, (2001), 2221-2222.

Jung, Hyungsuk, "Electrical characteristics of a TaOxNy/ZrSixOy stack gate dielectric for metal-oxide-semiconductor device applications", *Applied Physics Letters*, vol. 79, No. 26, (Dec. 24, 2001), 4408-4410.

Jung, Hyungsuk, "Electrical characteristics of an ultrathin (1.6 nm) TaOxNy gate dielectric", *Applied Physics Letters*, vol. 76, No. 24, (Jun. 12, 2000), 3630-3631.

Kim, C. T., "Application of Al2O3 Grown by Atomic Layer Deposition to DRAM and FeRAM", *12th International Symposium in Integrated Ferroelectrics*, (Mar. 2000), pp. 316.

Kim, Y., "Substrate dependence on the optical properties of Al2O3 films grown by atomic layer deposition", *Applied Physics Letters*, vol. 71, No. 25, (Dec. 22, 1997), 3604-3606.

Li, Al-Dong, "Characteristics of LaAlO3 gate dielectrics on Si grown by metalorganic chemical vapor deposition", *Applied Physics Letters*, vol. 83, No. 17, (Oct. 27, 2003), 3540-3542.

Lu, Xu-Bing, "Structure and dielectric prioperties of amorphous LaAlO3 and LaAlOxNy films as alternative gate dielectric materials", *Journal of Applied Physics*, vol. 94, No. 2, (Jul. 15, 2003), 1229-1234.

Nieminen, Minna, "Formation and stability of lanthanum oxide thin films deposited from B-diketonate precursor", *Applied Surface Science*, 174(2), (Apr. 16, 2001), 155-165.

Shi, G. H., "Impact of nitrogen concentration on the performance of LaAlO3(1-y/2) Ny films for high K date dielectric applications", *Journal of Physics D: Applied Physics*, 38, (2005), 442-445.

Shin, Chang H., "Fabrication and Characterization of MFISFET Using Al2O3 Insulating Layer for Non-volatile Memory", *12th International Symposium in Integrated Ferroelectrics*, (Mar. 2000), 9 pages.

Sneh, Ofer, "Thin film atomic layer deposition equipment for semiconductor processing", *Thin Solid Films*, 402(1-2), (Jan. 2002), 248-261.

Yan, L., "High quality, high-k gate dielectric: amorphous LaAlO3 thin films grown on Si(100) without Si interfacial layer", *Appl. Phys. A* 77, (2003), 721-724.

Ahn, K Y., "ALD of Silicon Films on Germanium", Appl. No. 11/498,576 filed Aug. 3, 2006.

Ahn, et al., "ALD of Zr-Substituted BaTiO$_3$ Films As Gate Dielectrics", U.S. Application No. U.S. Appl. No. 11/498,559, filed Aug. 3, 2006.

Ahn, K.Y., "Atomic Layer Deposited Barium Strontium Titanium Oxide Films", U.S. 11/510,803, filed Aug. 26, 2006.

Ahn, K Y., "Atomic Layer Deposited Titanium-Doped Indium Oxide Films", U.S. Appl. No. 11/400,836, filed Apr. 7, 2006.

Ahn, K Y., "Deposition of ZrAlON Films", U.S. Appl. No. 11/498,578, filed Aug. 3, 2006.

Ahn, Kie Y., et al., "Hafnium Lanthanide Oxynitride Films", U.S. Appl. No. Ser. No. 11/515,143, filed Aug. 31, 2006.

Nalwa, H. S., "Handbook of Thin Film Materials", *Deposition and Processing of thin Films*, vol. 1, San Diego : Academic Press,(2002),114-119.

Ahn, Kie Y., "Magnesium-Doped Zinc Oxide Structures and Methods", U.S. Appl. No. 11/706,820, filed Feb. 13, 2007. 23 pgs.

Ahn, Kie Y., "Molybdenum-Doped Indium Oxides Structures and Methods", U.S. Appl. No. 11/706,944, filed Feb. 13, 2007. 23 pgs.

\* cited by examiner

US 7,410,910 B2

LANTHANUM ALUMINUM OXYNITRIDE DIELECTRIC FILMS

TECHNICAL FIELD

This application relates generally to semiconductor devices and device fabrication, and more particularly, to dielectric layers and their method of fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling dielectric layers in devices such as, for example, capacitors and silicon based metal oxide semiconductor field effect transistors (MOSFETs) and variations thereof, which have primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

DETAILED DESCRIPTION

Figure 1:
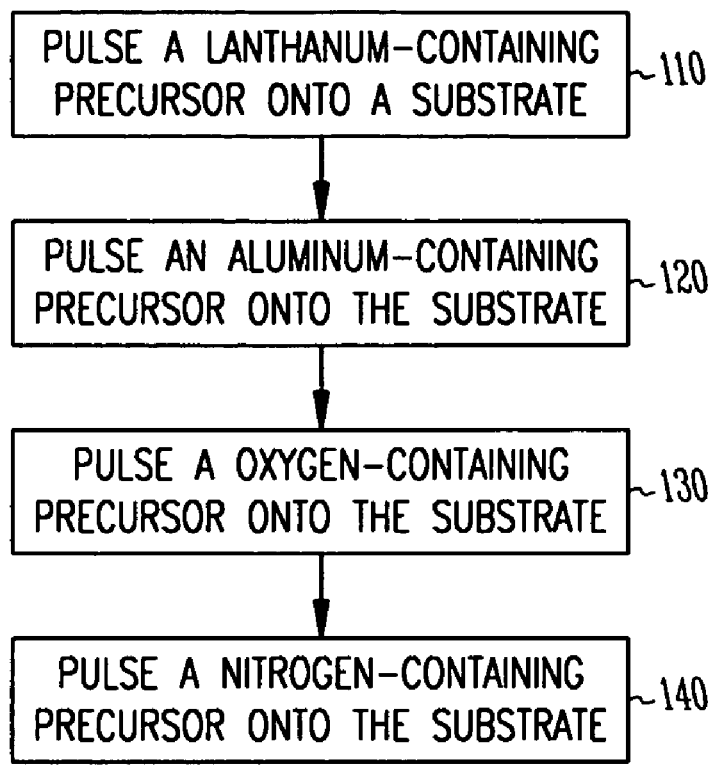
FIG. 1 illustrates features for an embodiment of a method to form a lanthanum aluminum oxynitride film by atomic layer deposition.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors. The following detailed description is, therefore, not to be taken in a limiting sense, and the scope of the present invention is defined only by the appended claims, along with the full scope of equivalents to which such claims are entitled.

To scale a dielectric region to minimize feature sizes to provide high density electronic devices, the dielectric region should have a reduced equivalent oxide thickness ($t_{eq}$). The equivalent oxide thickness quantifies the electrical properties, such as capacitance, of the dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface will have a $t_{eq}$ larger than its thickness, t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a $SiO_2$ layer used for a gate dielectric may need to be approximately 4 to 7 Å. Additional requirements on a $SiO_2$ layer would depend on the electrode used in conjunction with the $SiO_2$ dielectric. Using a conventional polysilicon electrode may result in an additional increase in $t_{eq}$ for the $SiO_2$ layer. This additional thickness may be eliminated by using a metal electrode, though such metal electrodes are not universally used for all devices. Thus, future devices would be designed towards a physical $SiO_2$ dielectric layer of about 5 Å or less. Such a small thickness requirement for a $SiO_2$ oxide layer creates additional problems.

Silicon dioxide is used as a dielectric layer in devices, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap may eliminate it as a material for a dielectric region in an electronic device. As the thickness of a $SiO_2$ layer decreases, the number of atomic layers, or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ dielectric may cause an effective short between an underlying Si electrode and an overlying polysilicon electrode. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a dielectric region in such future devices.

In many cases, for a typical dielectric layer, the capacitance is determined as one for a parallel plate capacitance: $C=\kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower device operating voltages and smaller device dimensions may be realized by a significant number of materials, but additional fabricating requirements make determining a suitable replacement for $SiO_2$ difficult. The current view for the microelectronics industry is still for Si based devices. This may require that the dielectric material employed be grown on a silicon substrate or a silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface.

One of the advantages of using $SiO_2$ as a dielectric layer in a device has been that the formation of the $SiO_2$ layer results in an amorphous dielectric. Having an amorphous structure for a dielectric provides for reducing problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Typically, materials having a high dielectric constant relative to $SiO_2$ also have a crystalline form, at least in a bulk configuration. The best candidates for replacing $SiO_2$ as a dielectric in a device are those that can be fabricated as a thin layer with an amorphous form and that have high dielectric constants.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles, creating pits. The surface of such a deposited layer can have a rough contour due to the rough interface at the body region.

In an embodiment, a lanthanum aluminum oxynitride dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited lanthanum aluminum oxynitride dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly larger, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming aluminum oxide from an $Al(CH_3)_3$ precursor and water vapor, as its reactant precursor, forms an embodiment of an aluminum/oxygen sequence, which can also be referred to as an aluminum sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, water vapor is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ compound uses one precursor that contains the elements A and B, such that pulsing the AB containing precursor followed by its reactant precursor onto a substrate may include a reaction that deposits $ABO_x$ on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of lanthanum aluminum oxynitride is formed on a substrate mounted in a reaction chamber using ALD in repetitive lanthanum, aluminum, and nitrogen sequences using precursor gases individually pulsed into the reaction chamber. Alternatively, solid or liquid precursors can be used in an appropriately designed reaction chamber.

In an embodiment, a lanthanum aluminum oxynitride layer may be structured as one or more monolayers. A film of lanthanum aluminum oxynitride, structured as one or more monolayers, may have a thickness that ranges from a monolayer to thousands of angstroms. The film may be processed by atomic layer deposition. Embodiments of an atomic layer deposited lanthanum aluminum oxynitride layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

The term lanthanum aluminum oxynitride is used herein with respect to a compound that essentially consists of lanthanum, aluminum, oxygen, and nitrogen in a form that may be stoichiometric, non-stoichiometric, or a combination of stoichiometric and non-stoichiometric. In an embodiment, the lanthanum aluminum oxynitride may be formed substantially as stoichiometric lanthanum aluminum oxynitride. In an embodiment, the lanthanum aluminum oxynitride may be formed substantially as a non-stoichiometric lanthanum aluminum oxynitride or a combination of non-stoichiometric lanthanum aluminum oxynitride and stoichiometric lanthanum aluminum oxynitride. Herein, lanthanum aluminum oxynitride may be expressed as LaAlON. The expression LaAlON or its equivalent forms may be used to include a stoichiometric lanthanum aluminum oxynitride. The expression LaAlON or its equivalent forms may be used to include a non-stoichiometric lanthanum aluminum oxynitride. The expression LaAlON or its equivalent forms may be used to include a combination of a stoichiometric lanthanum aluminum oxynitride and a non-stoichiometric lanthanum aluminum oxynitride. In an embodiment, a lanthanum aluminum oxynitride film includes $LaAlO_{3(1-y/2)}N_y$. In an embodiment, a lanthanum aluminum oxynitride film includes $LaAlO_{3(1-y/2)}N_y$, where $0.2<y<0.6$. The expression $LaO_x$ may be used to include a stoichiometric lanthanum oxide. The expression $LaO_x$ may be used to include a non-stoichiometric lanthanum oxide. The expression $LaO_x$ may be used to include a combination of a stoichiometric lanthanum oxide and a non-stoichiometric lanthanum oxide. Expressions $AlO_y$ and $NO_z$ may be used in the same manner as $LaO_x$. In various embodiments, a lanthanum aluminum oxynitride film may be doped with elements or compounds other than lanthanum, aluminum, oxygen, and nitrogen.

In an embodiment, a LaAlON film may be structured as one or more monolayers. In an embodiment, the LaAlON film may be constructed by atomic layer deposition. Prior to forming the LaAlON film by ALD, the surface on which the LaAlON film is to be deposited may undergo a preparation stage. The surface may be the surface of a substrate for an integrated circuit. In an embodiment, the substrate used for forming a transistor includes a silicon or silicon containing material. In other embodiments, germanium, gallium arsenide, silicon-on-sapphire substrates, or other suitable substrates may be used. A preparation process may include cleaning the substrate and forming layers and regions of the substrate, such as drains and sources prior to forming a gate dielectric in the formation of a metal oxide semiconductor (MOS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a lanthanum aluminum oxynitride dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a $SiO_2$ interface layer, or other composition interface layer, may improve the interface density, fixed charge density, and channel mobility of a device having this interface layer.

The sequencing of the formation of the regions of an electronic device, such as a transistor, being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

FIG. 1 illustrates features of an embodiment of a method to form a lanthanum aluminum oxynitride film by atomic layer deposition. The individual features labeled 110, 120, 130, and 140 may be performed in various orders. Between each pulsing of a precursor used in the atomic layer deposition process, a purging gas may be pulsed into the ALD reaction chamber. Between each pulsing of a precursor, the ALD reactor chamber may be evacuated using vacuum techniques as is known by those skilled in the art. Between each pulsing of a precursor, a purging gas may be pulsed into the ALD reaction chamber and the ALD reactor chamber may be evacuated.

At 110, a lanthanum-containing precursor is pulsed onto a substrate in an ALD reaction chamber. A number of precursors containing lanthanum may be used to deposit lanthanum on a substrate for an integrated circuit. In an embodiment, the lanthanum-containing precursor may be $La(thd)_3$ (thd=2,2,6,6-tetramethyl-3,5-heptanedione). In an embodiment using a $La(thd)_3$ precursor, the substrate may be maintained at a temperature ranging from 180° C. to about 425° C. In an embodiment, the lanthanum-containing precursor may be tris (2,2,6,6-tetramethyl-3,5-heptanedionato)lanthanum (III) tetraglyme adduct. In an embodiment, the lanthanum-containing precursor may be trisethylcyclopentadionato-lanthanum ($La(EtCp)_3$). In an embodiment using a $La(EtCp)_3$ precursor, the substrate temperature may be maintained at temperature ranging from about 400° C. to about 650° C. In an embodiment, the lanthanum-containing precursor may be trisdipyvaloylmethanatolanthanum ($La(DPM)_3$). In an embodiment, $H_2$ may be pulsed along with the $La(EtCp)_3$ precursor or the $La(DPM)_3$ precursor to reduce carbon contamination in the deposited film. After pulsing the lanthanum-containing precursor and purging the reaction chamber of excess precursor and by-products from pulsing the precursor, a reactant precursor may be pulsed into the reaction chamber. The reactant precursor may be an oxygen reactant precursor. In various embodiments, use of the individual lanthanum-containing precursors is not limited to the temperature ranges of the above embodiments. In addition, the pulsing of the lanthanum precursor may use a pulsing period that provides uniform coverage of a monolayer on the surface or may use a pulsing period that provides partial formation of a monolayer on the surface during a lanthanum sequence.

At 120, an aluminum-containing precursor is pulsed to the substrate. A number of precursors containing aluminum may be used to deposit the aluminum on the substrate. In an embodiment, the aluminum-containing precursor may be trimethylaluminum (TMA), $Al(CH_3)_3$. In an embodiment, the aluminum-containing precursor may be DMEAA (an adduct of alane ($AlH_3$) and dimethylethylamine $[N(CH_3)_2(C_2H_5)]$). In an embodiment using a DMEAA precursor, a hydrogen plasma may be introduced after pulsing the DMEAA precursor in a plasma-assisted atomic layer deposition process. In various embodiments, a LaAlON layer may be deposited on a substrate using plasma-assisted atomic layer deposition. During pulsing of the aluminum containing precursor, the substrate may be held between about 350° C. and about 450° C.

After pulsing the aluminum-containing precursor and purging the reaction chamber of excess precursor and by-products from pulsing the precursor, a reactant precursor may be pulsed into the reaction chamber. The reactant precursor may be an oxygen reactant precursor. In various embodiments, use of the individual aluminum-containing precursors is not limited to the temperature ranges of the above embodiments. In addition, the pulsing of the aluminum precursor may use a pulsing period that provides uniform coverage of a monolayer on the surface or may use a pulsing period that provides partial formation of a monolayer on the surface during an aluminum sequence.

At 130, an oxygen-containing precursor is pulsed to the substrate. The oxygen-containing precursor may be pulsed after a purge of the reaction chamber following each of the precursors providing lanthanum, aluminum, and nitrogen for the formation of a layer of LaAlON. Various oxygen-containing precursors may be used as oxygen reactant precursors for each of a lanthanum sequence, an aluminum sequence, and a nitrogen sequence. In various embodiments, oxygen-containing precursors for the ALD formation of a LaAlON film may include, but is not limited to, one or more of water, atomic oxygen, molecular oxygen, ozone, hydrogen peroxide, a water-hydrogen peroxide mixture, alcohol, or nitrous oxide.

At 140, a nitrogen-containing precursor is pulsed to the substrate. A number of precursors containing nitrogen may be used to deposit the nitrogen on the substrate. In an embodiment, the nitrogen-containing precursor may be nitrogen. In an embodiment, the nitrogen-containing precursor may be ammonia ($NH_3$). In an embodiment, the nitrogen-containing precursor may be tert-butylamine ($C_4H_{11}N$). In an embodiment, the nitrogen-containing precursor may be allylamine ($C_3H_7N$). In an embodiment, the nitrogen-containing precursor may be 1,1-dimethylhydrazine ($(CH_3)_2NNH_2$). Nitrogen-containing precursors may be used with oxygen-containing precursors in nitrogen ALD sequences. In an embodiment, a nitrogen-containing precursor may be used in a nitrogen sequence without a corresponding oxygen reactant precursor. In an embodiment, nitrogen may be pulsed into the ALD reaction chamber, as a nitrogen ALD sequence, to provide the nitrogen for the formation of an LaAlON film.

Embodiments for methods for forming lanthanum aluminum oxynitride film by atomic layer deposition may include numerous permutations of lanthanum sequences, aluminum sequences, and nitrogen sequences for forming the lanthanum aluminum oxynitride film. In an embodiment, an aluminum sequence is conducted before a lanthanum sequence. In an embodiment, a lanthanum sequence is conducted before an aluminum sequence. In an embodiment, a lanthanum/aluminum/nitrogen cycle may include a number, x, of lanthanum sequences, a number, y, of aluminum sequences, and a number, z, of nitrogen sequences. The number of sequences x, y, and z may be selected to engineer the relative amounts of aluminum to lanthanum. In an embodiment, the number of sequences x and y, along with associated pulsing periods and times, is selected to form a lanthanum aluminum oxynitride with substantially equal amounts of lanthanum and aluminum. In an embodiment, the number of sequences is selected with x=y. In an embodiment, the number of sequences x and y are selected to form a lanthanum-rich lanthanum aluminum oxynitride. Alternatively, the number of sequences x and y are selected to form an aluminum-rich lanthanum aluminum oxynitride. In an embodiment, the number of sequences x, y, and z may be selected to engineer the relative amounts of nitrogen to oxygen. In an embodiment, the number of sequences x, y, and z may be selected to engineer the relative amounts of nitrogen to oxygen to form $LaAlO_{3(1-j/2)}N_j$. In an embodiment, the number of sequences x, y, and z may be selected to engineer the relative amounts of nitrogen to oxygen to form a $LaAlO_{3(1-j/2)}N_j$ film, where j is selected to provide a nitrogen content such as to provide a maximum dielectric constant for a LaAlON film. In an embodiment, the number of sequences and the order of performing the sequences may be selected in an ALD cycle for LaAlON to provide a $LaAlO_{3(1-j/2)}N_j$ film, where $0.2<j<0.6$. In an embodiment, the nitrogen content may be adjusted to provide a lanthanum aluminum oxynitride film having a dielectric constant greater than 30. The nitrogen content may be adjusted to provide a lanthanum aluminum oxynitride film having a dielectric constant between 33 and 34.

In an embodiment of a method that includes forming a lanthanum aluminum oxynitride film, an atomic layer deposition sequence may include forming an atomic layer of lanthanum oxide followed by forming an atomic layer of aluminum oxide followed by a nitrogen sequence. In an embodiment of a method that includes forming a lanthanum aluminum oxynitride film, an atomic layer deposition sequence may include forming an atomic layer of aluminum oxide followed by forming an atomic layer of lanthanum oxide followed by a nitrogen sequence. In an embodiment, the nitrogen sequence may be applied between forming an atomic layer of lanthanum oxide and forming an atomic layer of aluminum oxide.

In various embodiments, nitrogen may be used as a purging gas and a carrier gas for one or more of the sequences used in the ALD formation of a LaAlON film. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

After repeating a selected number of ALD cycles, a determination may be made as to whether the number of lanthanum aluminum cycles equals a predetermined number to form the desired lanthanum aluminum oxynitride layer. If the total number of cycles to form the desired thickness has not been completed, a number of cycles for the lanthanum, aluminum, and nitrogen sequences is repeated. If the total number of cycles to form the desired thickness has been completed, the dielectric film containing the lanthanum aluminum oxynitride layer may optionally be annealed. The lanthanum aluminum oxynitride layer processed at these relatively low temperatures may provide an amorphous layer.

The thickness of a lanthanum aluminum oxynitride layer formed by atomic layer deposition may be determined by a fixed growth rate for the pulsing periods and precursors used, set at a value such as N nm/cycle, dependent upon the number of cycles of the lanthanum/aluminum/nitrogen sequences. For a desired lanthanum aluminum oxynitride layer thickness, t, in an application, the ALD process is repeated for t/N total cycles. Once the t/N cycles have completed, no further ALD processing for the lanthanum aluminum oxynitride layer is required.

In an embodiment, a modified cycle may include a number of lanthanum/aluminum cycles followed by exposure to nitrogen. The exposure to nitrogen may be realized in various manners such as annealing in a nitrogen atmosphere. The number of lanthanum/aluminum cycles may be selected to provide a thickness of material containing lanthanum, aluminum, and oxygen such that exposure to nitrogen for a selected period of time forms a base layer of LaAlON having a desired nitrogen content. The modified cycle may be repeated until the desired thickness for a LaAlON layer to be used in the device being fabrication is attained. In addition, the completed LaAlON layer may have a selected nitrogen content.

Atomic layer deposition of the individual components of the lanthanum aluminum oxynitride film allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a LaAlON film, each precursor may be pulsed into the reaction under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

Films of LaAlON may be processed over a wide range of temperatures. Low temperature processing may lead to an amorphous structure and have fewer adverse effects on the substrate and any devices formed prior to the ALD formation of the lanthanum aluminum oxynitride film. In an embodiment, a film of LaAlON is formed on a substrate with the substrate maintained at a temperature in the range from about 100° C. to about 600° C. The lanthanum aluminum oxynitride film may be formed as an integral component of an electronic device in an integrated circuit.

Either before or after forming the lanthanum aluminum oxynitride film, other dielectric layers such as nitride layers, dielectric metal silicates, insulating metal oxides including $Al_2O_3$, $La_2O_3$, and other lanthanide oxides such as $Pr_2O_3$, $Nd_2O_3$, $Sm_2O_3$, $Gd_2O_3$, $Dy_2O_3$, $Ce_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$ or combinations thereof may be formed as part of a dielectric layer or dielectric stack. These one or more other layers of dielectric material may be provided in stoichiometric form, in non-stoichiometric form, or a combination of stoichiometric dielectric material and non-stoichiometric dielectric material. Depending on the application, a dielectric stack containing a lanthanum aluminum oxynitride film may include a silicon oxide layer. In an embodiment, the dielectric layer may be formed as a nanolaminate. An embodiment of a nanolaminate may include a layer of lanthanum oxide and a lanthanum aluminum oxynitride film, a layer of aluminum oxide and a lanthanum aluminum oxynitride film, layers of lanthanum oxide and aluminum oxide along with a lanthanum aluminum oxynitride film, or various other combinations. Alternatively, a dielectric layer may be formed substantially as the lanthanum aluminum oxynitride film.

In various embodiments, the structure of an interface between a dielectric layer and a substrate on which it is disposed is controlled to limit the inclusion of silicon oxide, since a silicon oxide layer would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In the various embodiments, the thickness of a lanthanum aluminum oxynitride film is related to the number of ALD cycles performed and the growth rate associated with the selected permutations of sequences in the cycles. As can be understood by those skilled in the art, particular effective growth rates for the engineered lanthanum aluminum oxynitride film can be determined during normal initial testing of the ALD system for processing a lanthanum aluminum oxynitride dielectric for a given application without undue experimentation.

In an embodiment, the lanthanum aluminum oxynitride layer may be doped with other lanthanides such as Pr, N, Sm, Gd, Dy, Ce, Tb, Er, Eu, Lu, Tm, Ho, Pm, and Yb. The doping may be employed to enhance the leakage current characteristics of the dielectric layer containing the lanthanum aluminum oxynitride by providing a disruption or perturbation of the lanthanum aluminum oxynitride structure. Such doping may be realized by substituting a sequence of one of these lanthanides for a lanthanum sequence or an aluminum sequence. The choice for substitution may depend on the form of the lanthanum aluminum oxynitride structure with respect to the ratio of lanthanum atoms to aluminum desired in the oxide. To maintain a substantially lanthanum aluminum oxynitride, the amount of alternate lanthanides doped into the oxide may be limited to a relatively small fraction of the total number of lanthanum and aluminum atoms. Such a fraction may be 10 percent or less.

In an embodiment, a dielectric layer containing a lanthanum aluminum oxynitride layer may have a $t_{eq}$ ranging from about 5 Å to about 20 Å. In an embodiment, a dielectric layer containing a lanthanum aluminum oxynitride layer may have a $t_{eq}$ of less than 5 Å. In an embodiment, a lanthanum aluminum oxynitride film may be formed with a thickness ranging from a monolayer to thousands of angstroms. Further, dielectric films of lanthanum aluminum oxynitride formed by atomic layer deposition may provide not only thin $t_{eq}$ films, but also films with relatively low leakage current. Additionally, embodiments may be implemented to form transistors, capacitors, memory devices, and other electronic systems including information handling devices.

Figure 2:
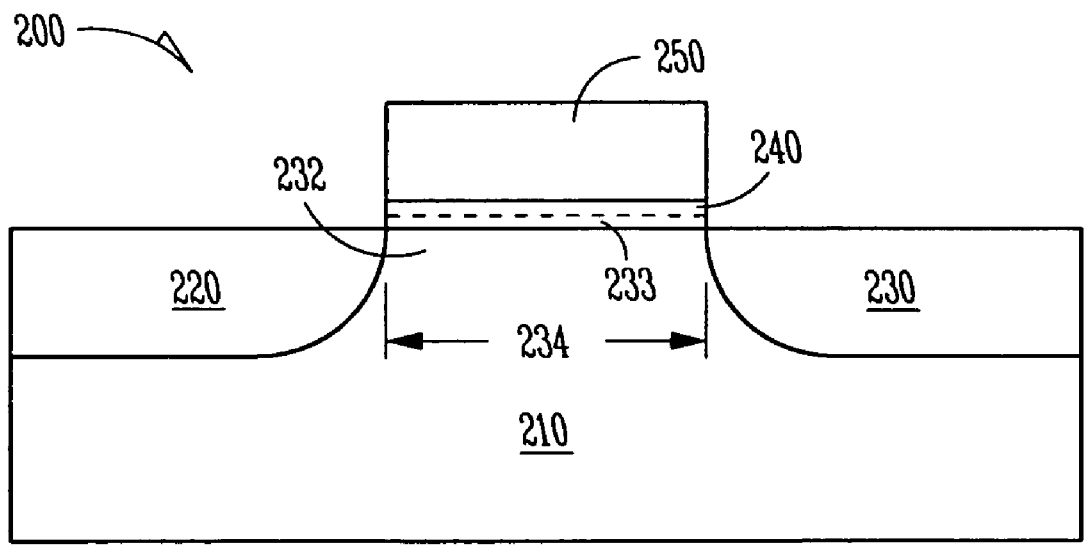
FIG. 2 shows an embodiment of a transistor having a dielectric layer containing a lanthanum aluminum oxynitride film.

FIG. 2 shows an embodiment of a transistor 200 having a dielectric layer 240 containing a lanthanum aluminum oxynitride film. Transistor 200 may include a source region 220 and a drain region 230 in a silicon-based substrate 210 where source and drain regions 220, 230 are separated by a body region 232. Body region 232 defines a channel having a channel length 234. A gate dielectric 240 may be disposed on substrate 210, with gate dielectric 240 formed as a dielectric layer containing lanthanum aluminum oxynitride. Gate dielectric 240 may be realized as a dielectric layer formed substantially of lanthanum aluminum oxynitride. Gate dielectric 240 may be a dielectric stack containing at least one lanthanum aluminum oxynitride film and one or more layers of insulating material other than a lanthanum aluminum oxynitride film. The lanthanum aluminum oxynitride may be structured as one or more monolayers. An embodiment of a lanthanum aluminum oxynitride film may be formed by atomic layer deposition. A gate 250 may be formed over and contact gate dielectric 240.

An interfacial layer 233 may form between body region 232 and gate dielectric 240. In an embodiment, interfacial layer 233 may be limited to a relatively small thickness compared to gate dielectric 240, or to a thickness significantly less than gate dielectric 240 as to be effectively eliminated. Forming the substrate and the source and drain regions may be performed using standard processes known to those skilled in the art. Additionally, the sequencing of the various elements of the process for forming a transistor may be conducted with fabrication processes known to those skilled in the art. In an embodiment, gate dielectric 240 may be realized as a gate insulator in a silicon CMOS. Use of a gate dielectric containing lanthanum aluminum oxynitride is not limited to silicon based substrates, but may be used with a variety of semiconductor substrates.

Figure 3:
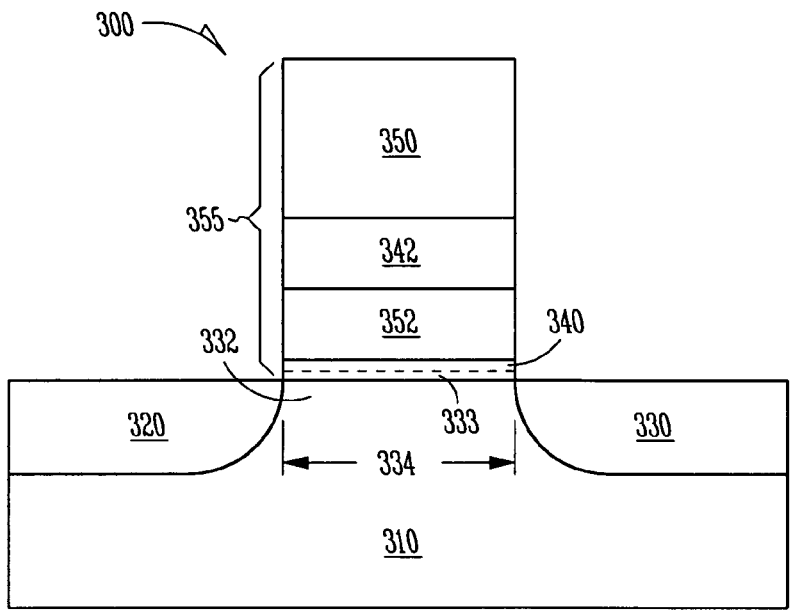
FIG. 3 shows an embodiment of a floating gate transistor having a dielectric layer containing a lanthanum aluminum oxynitride film.

FIG. 3 shows an embodiment of a floating gate transistor 300 having a dielectric layer containing a lanthanum aluminum oxynitride film. The lanthanum aluminum oxynitride film may be structured as one or more monolayers. The lanthanum aluminum oxynitride film may be formed using atomic layer deposition techniques. Transistor 300 may include a silicon-based substrate 310 with a source 320 and a drain 330 separated by a body region 332. Body region 332 between source 320 and drain 330 defines a channel region having a channel length 334. Located above body region 332 is a stack 355 including a gate dielectric 340, a floating gate 352, a floating gate dielectric 342, and a control gate 350. An interfacial layer 333 may form between body region 332 and gate dielectric 340. In an embodiment, interfacial layer 333 may be limited to a relatively small thickness compared to gate dielectric 340, or to a thickness significantly less than gate dielectric 340 as to be effectively eliminated.

In an embodiment, gate dielectric 340 includes a dielectric containing an atomic layer deposited lanthanum aluminum oxynitride film formed in embodiments similar to those described herein. Gate dielectric 340 may be realized as a dielectric layer formed substantially of lanthanum aluminum oxynitride. Gate dielectric 340 may be a dielectric stack containing at least one lanthanum aluminum oxynitride film and one or more layers of insulating material other than a lanthanum aluminum oxynitride film. In an embodiment, floating gate 352 may be formed over and contact gate dielectric 340.

In an embodiment, floating gate dielectric 342 includes a dielectric containing a lanthanum aluminum oxynitride film. The LaAlON film may be structured as one or more monolayers. In an embodiment, the LaAlON may be formed using atomic layer deposition techniques. Floating gate dielectric 342 may be realized as a dielectric layer formed substantially of lanthanum aluminum oxynitride. Floating gate dielectric 342 may be a dielectric stack containing at least one lanthanum aluminum oxynitride film and one or more layers of insulating material other than a lanthanum aluminum oxynitride film. In an embodiment, control gate 350 may be formed over and contact floating gate dielectric 342.

Alternatively, both gate dielectric 340 and floating gate dielectric 342 may be formed as dielectric layers containing a lanthanum aluminum oxynitride film structured as one or more monolayers. Gate dielectric 340 and floating gate dielectric 342 may be realized by embodiments similar to those described herein, with the remaining elements of the transistor 300 formed using processes known to those skilled in the art. In an embodiment, gate dielectric 340 forms a tunnel gate insulator and floating gate dielectric 342 forms an inter-gate insulator in flash memory devices, where gate dielectric 340 and floating gate dielectric 342 may include a lanthanum aluminum oxynitride film structured as one or more monolayers. Such structures are not limited to silicon based substrates, but may be used with a variety of semiconductor substrates.

Figure 4:
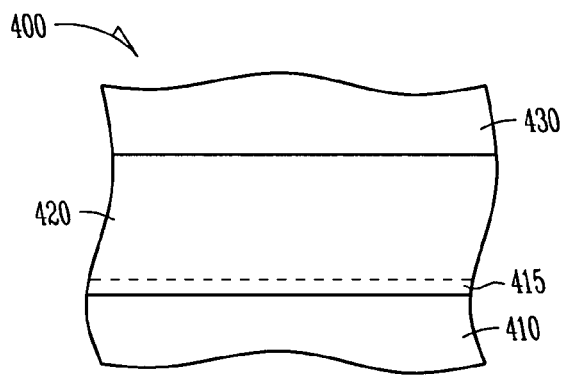
FIG. 4 shows an embodiment of a capacitor having a dielectric layer containing a lanthanum aluminum oxynitride film.

Embodiments of a lanthanum aluminum oxynitride film structured as one or more monolayers may also be applied to capacitors in various integrated circuits, memory devices, and electronic systems. In an embodiment for a capacitor 400 illustrated in FIG. 4, a method includes forming a first conductive layer 410, forming a dielectric layer 420 containing a lanthanum aluminum oxynitride film structured as one or more monolayers on first conductive layer 410, and forming a second conductive layer 430 on dielectric layer 420. Dielectric layer 420, containing a lanthanum aluminum oxynitride film, may be formed using various embodiments described herein. Dielectric layer 420 may be realized as a dielectric layer formed substantially of lanthanum aluminum oxynitride. Dielectric layer 420 may be a dielectric stack containing at least one lanthanum aluminum oxynitride film and one or more layers of insulating material other than a lanthanum aluminum oxynitride film. An interfacial layer 415 may form between first conductive layer 410 and dielectric layer 420. In an embodiment, interfacial layer 415 may be limited to a relatively small thickness compared to dielectric layer 420, or to a thickness significantly less than dielectric layer 420 as to be effectively eliminated.

Embodiments for a lanthanum aluminum oxynitride film structured as one or more monolayers may include, but are not limited to, a capacitor in a DRAM and capacitors in analog, radio frequency (RF), and mixed signal integrated circuits. Mixed signal integrated circuits are integrated circuits that may operate with digital and analog signals.

Figure 5:
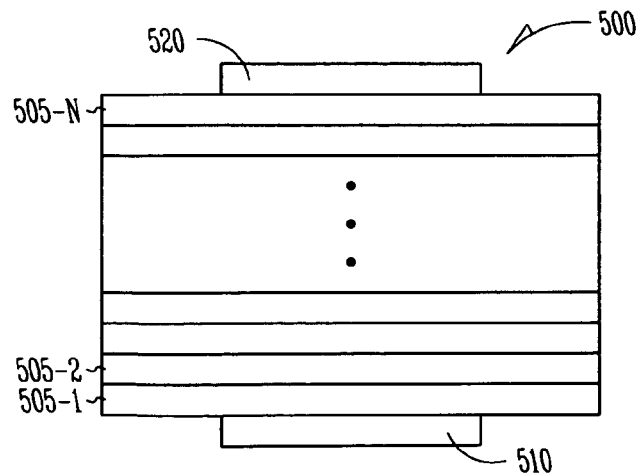
FIG. 5 depicts an embodiment of a dielectric layer having multiple layers including a lanthanum aluminum oxynitride layer.

FIG. 5 depicts an embodiment of a dielectric structure 500 having multiple dielectric layers 505-1, 505-2, . . . 505-N, in which at least one layer is a lanthanum aluminum oxynitride layer. Layers 510 and 520 may provide means to contact dielectric layers 505-1, 505-2, . . . 505-N. Layers 510 and 520 maybe electrodes forming a capacitor. Layer 510 may be a body region of a transistor with layer 520 being a gate. Layer 510 may be a floating gate electrode with layer 520 being a control gate.

In an embodiment, each layer 505-1, 505-2 to 505-N may be a lanthanum aluminum oxynitride layer. At least one of the layers 505-1, 505-2, . . . 505-N has a nitrogen content that is different from the nitrogen content of the other layers. In an embodiment, no two of layers 505-1, 505-2, . . . 505-N have the same content. Each lanthanum aluminum oxynitride layer 505-1, 505-2, . . . 505-N may be formed by atomic layer deposition. The nitrogen content may be varied between the different layers 505-1, 505-2, . . . 505-N by using different ALD cycles in the formation of these layers. In an embodiment, each layer may be formed substantially as $LaAlO_{3(1-y/2)}N_y$, where the value of y is selected to be different in each layer 505-1, 505-2, . . . 505-N. In an embodiment, y is selected to be between 0.2 and 0.6.

In an embodiment, dielectric structure 500 includes one or more layers of 505-1, 505-2, . . . 505-N as dielectric layers other than a LaAlON layer, where at least one layer is a LaAlON layer. Dielectric layers 505-1, 505-2, . . . 505-N may include a $LaO_x$ layer. Dielectric layers 505-1, 505-2, . . . 505-N may include an $AlO_x$ layer. Dielectric layers 505-1, 505-2, . . . 505-N may include an insulating metal oxide layer, whose metal is selected to be a metal different from lanthanum and aluminum. Dielectric layers 505-1, 505-2, . . . 505-N may include an insulating nitride layer. Dielectric layers 505-1, 505-2, . . . 505-N may include an insulating oxynitride layer. Dielectric layers 505-1, 505-2, . . . 505-N may include a silicon nitride layer. Dielectric layers 505-1, 505-2, . . . 505-N may include an insulating silicate layer. Dielectric layers 505-1, 505-2, . . . 505-N may include a silicon oxide layer.

Various embodiments for a dielectric layer containing a lanthanum aluminum oxynitride film structured as one or more monolayers may provide for enhanced device performance by providing devices with reduced leakage current. Such improvements in leakage current characteristics may be attained by forming one or more layers of a lanthanum aluminum oxynitride in a nanolaminate structure with other metal oxides, non-metal-containing dielectrics, or combinations thereof. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a $LaO_x$/LaAlON nanolaminate contains alternating layers of lanthanum oxide and LaAlON. In an embodiment, an $AlO_y$/LaAlON nanolaminate contains alternating layers of aluminum oxide and LaAlON. In an embodiment, a $LaO_z$/$AlO_y$/LaAlON nanolaminate contains various permutations of lanthanum oxide layers, aluminum oxide layers, and lanthanum aluminum oxynitride layers.

In an embodiment, dielectric structure 500 may be structured as a nanolaminate structure 500 including a lanthanum aluminum oxynitride film structured as one or more monolayers. Nanolaminate structure 500 includes a plurality of layers 505-1, 505-2 to 505-N, where at least one layer contains a lanthanum aluminum oxynitride film structured as one or more monolayers. The other layers may be insulating nitrides, insulating oxynitrides, and other dielectric materials such as insulating metal oxides. The sequencing of the layers depends on the application. The effective dielectric constant associated with nanolaminate structure 500 is that attributable to N capacitors in series, where each capacitor has a thickness defined by the thickness and composition of the corresponding layer. By selecting each thickness and the composition of each layer, a nanolaminate structure can be engineered to have a predetermined dielectric constant. Embodiments for structures such as nanolaminate structure 500 may be used as nanolaminate dielectrics in NROM flash memory devices as well as other integrated circuits. In an embodiment, a layer of the nanolaminate structure 500 is used to store charge in the NROM device. The charge storage layer of a nanolaminate structure 500 in an NROM device may be a silicon oxide layer.

Transistors, capacitors, and other devices may include dielectric films containing a lanthanum aluminum oxynitride layer structured as one or more monolayers. The lanthanum aluminum oxynitride layer may be formed by atomic layer deposition. Dielectric films containing a lanthanum aluminum oxynitride layer may be implemented into memory devices and electronic systems including information handling devices. Further, embodiments of electronic devices may be realized as integrated circuits. Embodiments of information handling devices may include wireless systems, telecommunication systems, and computers.

Figure 6:
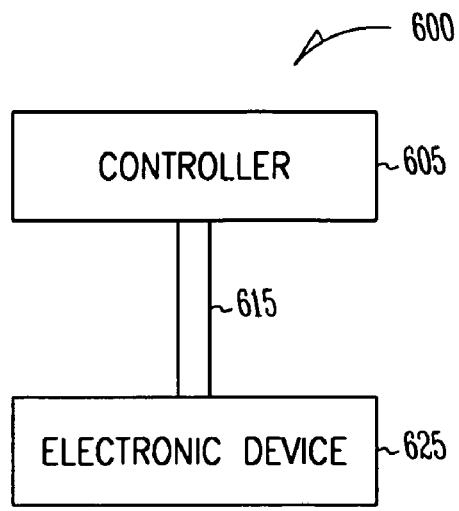
FIG. 6 is a simplified diagram for an embodiment of a controller coupled to an electronic device having a dielectric layer containing a lanthanum aluminum oxynitride film.

FIG. 6 illustrates a block diagram for an electronic system 600 having one or more devices having a dielectric structure including a lanthanum aluminum oxynitride film structured as one or more monolayers. Electronic system 600 includes a controller 605, a bus 615, and an electronic device 625, where bus 615 provides electrical conductivity between controller 605 and electronic device 625. In various embodiments, controller 605 may include an embodiment of a lanthanum aluminum oxynitride film. In various embodiments, electronic device 625 may include an embodiment of a lanthanum aluminum oxynitride film. In various embodiments, controller 605 and electronic device 625 may include embodiments of a lanthanum aluminum oxynitride film. Electronic system 600 may include, but is not limited to, fiber optic systems, electro-optic systems, and information handling systems such as wireless systems, telecommunication systems, and computers.

Figure 7:
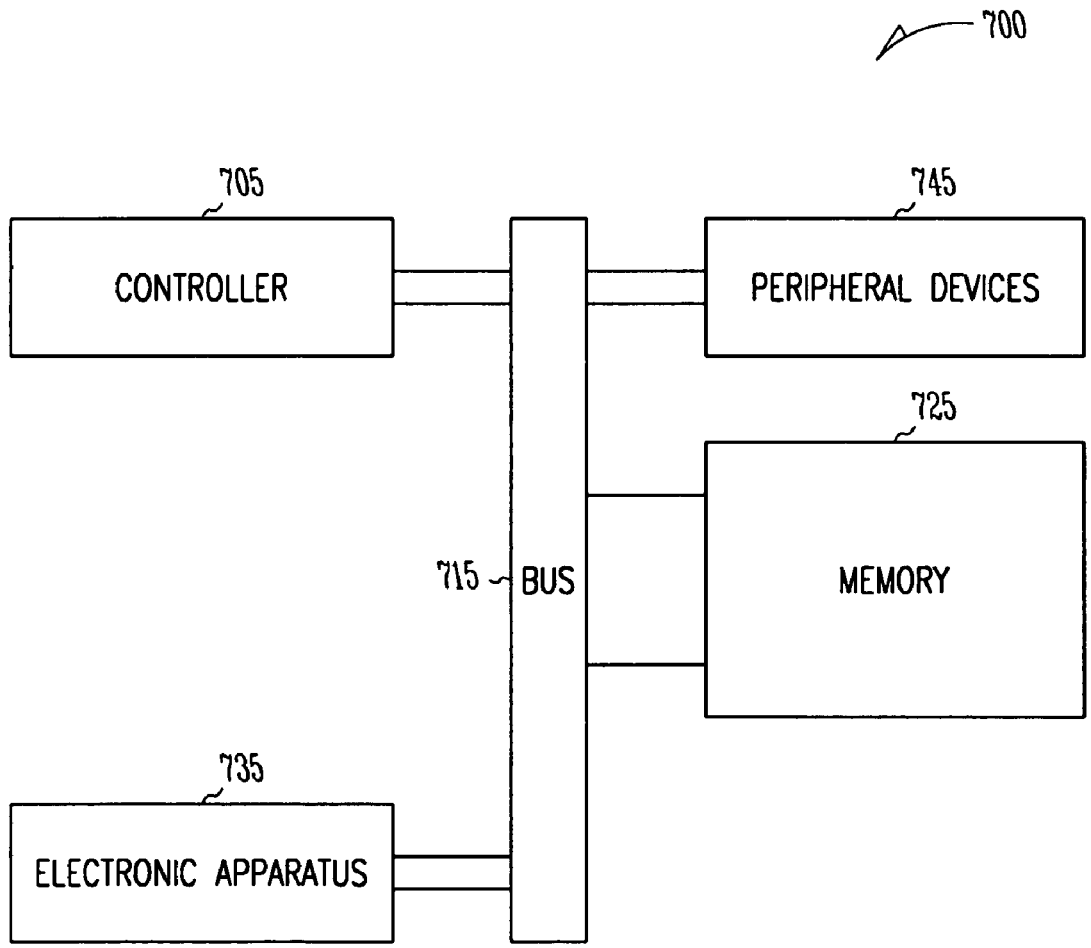
FIG. 7 illustrates a diagram for an embodiment of an electronic system having devices with a dielectric film containing a lanthanum aluminum oxynitride film.

FIG. 7 depicts a diagram of an embodiment of a system 700 having a controller 705 and a memory 725. Controller 705 may include a lanthanum aluminum oxynitride film structured as one or more monolayers. Memory 725 may include a lanthanum aluminum oxynitride film structured as one or more monolayers. Controller 705 and memory 725 may include a lanthanum aluminum oxynitride film structured as one or more monolayers. System 700 also includes an electronic apparatus 735 and a bus 715, where bus 715 provides electrical conductivity between controller 705 and electronic apparatus 735, and between controller 705 and memory 725. Bus 715 may include an address, a data bus, and a control bus, each independently configured. Alternatively, bus 715 may use common conductive lines for providing one or more of address, data, or control, the use of which is regulated by controller 705. In an embodiment, electronic apparatus 735 may be additional memory configured in a manner similar to memory 725. An embodiment may include an additional peripheral device or devices 745 coupled to bus 715. In an embodiment, controller 705 is a processor. One or more of controller 705, memory 725, bus 715, electronic apparatus 735, or peripheral devices 745 may include an embodiment of a dielectric layer having a lanthanum aluminum oxynitride film structured as one or more monolayers System 700 may include, but is not limited to, information handling devices, telecommunication systems, and computers.

Peripheral devices 745 may include displays, additional storage memory, or other control devices that may operate in conjunction with controller 705. Alternatively, peripheral devices 745 may include displays, additional storage memory, or other control devices that may operate in conjunction with memory 725 or controller 705 and memory 725.

Memory 725 may be realized as a memory device containing a lanthanum aluminum oxynitride film structured as one or more monolayers. The lanthanum aluminum oxynitride structure may be formed in a memory cell of a memory array. The lanthanum aluminum oxynitride structure may be formed in a capacitor in a memory cell of a memory array. The lanthanum aluminum oxynitride structure may be formed in a transistor in a memory cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

An embodiment for a method includes forming a lanthanum aluminum oxynitride film by atomic layer deposition. Embodiments include structures for capacitors, transistors, memory devices, and electronic systems with a lanthanum aluminum oxynitride film structured as one or more monolayers, and methods for forming such structures.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
   forming a lanthanum aluminum oxynitride film in an integrated circuit on a substrate including forming the lanthanum aluminum oxynitride film by atomic layer deposition, the atomic layer deposition having one or more cycles, each cycle including:
   performing one or more lanthanum/oxygen sequences;
   performing one or more aluminum/oxygen sequences; and
   performing one or more nitrogen/oxygen sequences using a nitrogen precursor and an oxygen reactant precursor to the nitrogen precursor in the nitrogen/oxygen sequences.

2. The method of claim 1, wherein forming the lanthanum aluminum oxynitride film by atomic layer deposition includes forming the lanthanum aluminum oxynitride film as multiple layers of lanthanum aluminum oxynitride, each layer formed by atomic layer deposition, in which at least one layer has a nitrogen content different from the other layers of the lanthanum aluminum oxynitride film.

3. The method of claim 1, wherein forming the lanthanum aluminum oxynitride film includes forming $LaAlO_{3(1-y/2)}N_y$, where $0.2<y<0.6$.

4. The method of claim 1, wherein forming the lanthanum aluminum oxynitride film by atomic layer deposition includes using a $La(thd)_3$ precursor in the atomic layer deposition.

5. The method of claim 1, wherein forming the lanthanum aluminum oxynitride film by atomic layer deposition includes using a trisethylcyclopentadionatolanthanum precursor in the atomic layer deposition.

6. The method of claim 1, wherein forming the lanthanum aluminum oxynitride film by atomic layer deposition includes using a trisdipyvaloylmethanatolanthanum precursor in the atomic layer deposition.

7. The method of claim 1, wherein forming the lanthanum aluminum oxynitride film by atomic layer deposition includes using tris (2,2,6,6-tetramethyl-3,5-heptanedionato) lanthanum (III) tetraglyme adduct as a precursor in the atomic layer deposition.

8. The method of claim 1, wherein forming the lanthanum aluminum oxynitride film by atomic layer deposition includes using an adduct of alane and dimethylethylamine as a precursor in the atomic layer deposition.

9. The method of claim 1, wherein forming the lanthanum aluminum oxynitride film by atomic layer deposition includes using a trimethylaluminum precursor in the atomic layer deposition.

10. The method of claim 1, wherein forming the lanthanum aluminum oxynitride film by atomic layer deposition includes forming the lanthanum aluminum oxynitride film using plasma-assisted atomic layer deposition.

11. The method of claim 1, wherein forming the lanthanum aluminum oxynitride film by atomic layer deposition includes using a nitrogen-containing precursor in the atomic layer deposition.

12. The method of claim 1, wherein forming the lanthanum aluminum oxynitride film by atomic layer deposition includes using an ammonia precursor in the atomic layer deposition.

13. The method of claim 1, wherein the method includes forming a transistor having a gate dielectric containing the lanthanum aluminum oxynitride film.

14. The method of claim 1, wherein the method includes forming a capacitor having a capacitor dielectric containing the lanthanum aluminum oxynitride film.

15. The method of claim 1, wherein the method includes forming a memory device containing the lanthanum aluminum oxynitride film.

16. The method of claim 1, wherein the method includes forming a conductive path to a conductive layer on and contacting the lanthanum aluminum oxynitride film to provide a signal to the conductive layer to operate in an electronic system.

17. A method comprising:
    forming a lanthanum aluminum oxynitride film in an integrated circuit on a substrate including forming the lanthanum aluminum oxynitride film by atomic layer deposition using a tert-butylamine precursor in the atomic layer deposition.

18. A method comprising:
    forming a lanthanum aluminum oxynitride film in an integrated circuit on a substrate including forming the lanthanum aluminum oxynitride film by atomic layer deposition using an allylamine precursor in the atomic layer deposition.

19. A method comprising:
    forming a lanthanum aluminum oxynitride film in an integrated circuit on a substrate including forming the lanthanum aluminum oxynitride film by atomic layer deposition using a 1,1-dimethylhydrazine precursor in the atomic layer deposition.

20. A method comprising:
    forming a first electrode on a substrate;
    forming a dielectric layer containing a lanthanum aluminum oxynitride film, including forming the lanthanum aluminum oxynitride film by atomic layer deposition, the atomic layer deposition having one or more cycles, each cycle including:
    performing one or more lanthanum/oxygen sequences;
    performing one or more aluminum/oxygen sequences; and
    performing one or more nitrogen/oxygen sequences using a nitrogen precursor and an oxygen reactant precursor to the nitrogen precursor in the nitrogen/oxygen sequences, the dielectric layer disposed on and contacting the first electrode; and
    forming a second electrode on and contacting the dielectric layer.

21. The method of claim 20, wherein forming the lanthanum aluminum oxynitride film by atomic layer deposition includes using a $La(thd)_3$ precursor, a DMEAA precursor, and nitrogen in the atomic layer deposition.

22. The method of claim 20, wherein the method includes forming the first electrode, the dielectric layer, and the second electrode as a capacitor in a dynamic random access memory.

23. The method of claim 20, wherein the method includes forming the first electrode, the dielectric layer, and the second electrode as a capacitor in an analog integrated circuit.

24. The method of claim 20, wherein the method includes forming the first electrode, the dielectric layer, and the second electrode as a capacitor in a radio frequency integrated circuit.

25. The method of claim 20, wherein the method includes forming the first electrode, the dielectric layer, and the second electrode as a capacitor in a mixed signal integrated circuit.

26. The method of claim 20, wherein forming a dielectric layer includes forming the dielectric layer having multiple layers of dielectrics within which the lanthanum aluminum oxynitride film is disposed.

27. The method of claim 20, wherein forming the dielectric layer having multiple layers of dielectrics includes forming a nanolaminate.

28. The method of claim 20, wherein forming the lanthanum aluminum oxynitride film by atomic layer deposition includes forming the lanthanum aluminum oxynitride film as multiple layers of lanthanum aluminum oxynitride, each layer formed by atomic layer deposition, in which at least one layer of the multiple layers has a nitrogen content different from the other layers of the lanthanum aluminum oxynitride film.

29. The method of claim 20, wherein forming the lanthanum aluminum oxynitride film includes forming $LaAlO_{3(1-y/2)}N_y$, where $0.2<y<0.6$.

30. A method comprising:
forming a source and a drain of a transistor, the source and the drain separated by a channel;
forming a dielectric layer above the channel, the dielectric layer containing a lanthanum aluminum oxynitride film, including forming the lanthanum aluminum oxynitride film by atomic layer deposition, the atomic layer deposition having one or more cycles, each cycle including:
performing one or more lanthanum/oxygen sequences;
performing one or more aluminum/oxygen sequences; and
performing one or more nitrogen/oxygen sequences using a nitrogen precursor and an oxygen reactant precursor to the nitrogen precursor in the nitrogen/oxygen sequences; and
forming a gate above the dielectric layer.

31. The method of claim 30, wherein forming the lanthanum aluminum oxynitride film by atomic layer deposition includes using a $La(thd)_3$ precursor, a trimethylaluminum precursor, and nitrogen in the atomic layer deposition.

32. The method of claim 30, wherein the method includes forming the dielectric layer as a gate insulator in a transistor of a CMOS device.

33. The method of claim 30, wherein forming a dielectric layer includes forming the dielectric layer as a gate dielectric contacting the channel.

34. The method of claim 30, wherein forming a dielectric layer includes forming the dielectric layer as a tunnel gate insulator contacting the channel.

35. The method of claim 30, wherein forming a dielectric layer includes forming the dielectric layer on and contacting a floating gate.

36. The method of claim 30, wherein the method includes forming the dielectric layer as a tunnel insulator contacting the channel and forming a floating gate dielectric on and contacting a floating gate, the floating gate dielectric containing a lanthanum aluminum oxynitride film.

37. The method of claim 30, wherein forming the lanthanum aluminum oxynitride film by atomic layer deposition includes forming the lanthanum aluminum oxynitride film as multiple layers of lanthanum aluminum oxynitride, each layer formed by atomic layer deposition, in which at least one layer of the multiple layers has a nitrogen content different from the other layers of the lanthanum aluminum oxynitride film.

38. The method of claim 30, wherein forming the lanthanum aluminum oxynitride film includes forming $LaAlO_{3(1-y/2)}N_y$, where $0.2<y<0.6$.

39. A method comprising:
forming an array of memory cells in a substrate, a memory cell having a dielectric layer containing a lanthanum aluminum oxynitride film, including forming the lanthanum aluminum oxynitride film by atomic layer deposition, the atomic layer deposition having one or more cycles, each cycle including:
performing one or more lanthanum/oxygen sequences;
performing one or more aluminum/oxygen sequences; and
performing one or more nitrogen/oxygen sequences using a nitrogen precursor and an oxygen reactant precursor to the nitrogen precursor in the nitrogen/oxygen sequences.

40. The method of claim 39, wherein forming the lanthanum aluminum oxynitride film by atomic layer deposition includes using a $La(thd)_3$ precursor, a trimethylaluminum precursor, and a nitrogen-containing precursor in the atomic layer deposition.

41. The method of claim 39, wherein the method includes forming the dielectric layer as a gate insulator of a transistor in a memory device.

42. The method of claim 39, wherein the method includes forming the dielectric layer as a tunnel gate insulator in a flash memory.

43. The method of claim 39, wherein the method includes forming the dielectric layer as an inter-gate insulator in a flash memory.

44. The method of claim 39, wherein the method includes forming the dielectric layer as a dielectric of a capacitor in a memory cell.

45. The method of claim 39, wherein the method includes forming a dynamic random access memory.

46. The method of claim 39, wherein the method includes forming the dielectric layer as a nanolaminate dielectric.

47. The method of claim 39, wherein the method includes forming the dielectric layer as a nanolaminate dielectric in a NROM flash memory.

48. The method of claim 39, wherein forming the lanthanum aluminum oxynitride film by atomic layer deposition includes forming the lanthanum aluminum oxynitride film as multiple layers of lanthanum aluminum oxynitride, each layer formed by atomic layer deposition, in which at least one layer of the multiple layers has a nitrogen content different from the other layers of the lanthanum aluminum oxynitride film.

49. The method of claim 39, wherein forming the lanthanum aluminum oxynitride film includes forming $LaAlO_{3(1-y/2)}N_y$, where $0.2<y<0.6$.

50. A method comprising:
providing a controller; and
coupling an integrated circuit to the controller, wherein the integrated circuit includes a dielectric layer containing a lanthanum aluminum oxynitride layer, the lanthanum aluminum oxynitride layer formed by atomic layer deposition, the atomic layer deposition having one or more cycles, each cycle including:
performing one or more lanthanum/oxygen sequences;
performing one or more aluminum/oxygen sequences; and
performing one or more nitrogen/oxygen sequences using a nitrogen precursor and an oxygen reactant precursor to the nitrogen precursor in the nitrogen/oxygen sequences.

51. The method of claim 50, wherein forming the lanthanum aluminum oxynitride film by atomic layer deposition includes using a $La(thd)_3$ precursor, an $Al(CH_3)_3$ precursor, and nitrogen in the atomic layer deposition.

52. The method of claim 50, wherein forming the lanthanum aluminum oxynitride film by atomic layer deposition includes forming the lanthanum aluminum oxynitride film as multiple layers of lanthanum aluminum oxynitride, each layer formed by atomic layer deposition, in which at least one layer of the multiple layers has a nitrogen content different from the other layers of the lanthanum aluminum oxynitride film.

53. The method of claim 50, wherein forming the lanthanum aluminum oxynitride film includes forming $LaAlO_{3(1-y/2)}N_y$, where $0.2<y<0.6$.

54. The method of claim 50, wherein coupling an integrated circuit to the controller includes coupling a memory device formed as the integrated circuit.

55. The method of claim 50, wherein providing a controller includes providing a processor.

56. The method of claim 50, wherein coupling an integrated circuit to the controller includes coupling a mixed signal integrated circuit formed as the integrated circuit.

57. The method of claim 50, wherein the method includes forming an information handling system.

58. The method of claim 57, wherein forming an information handling system includes forming a wireless system.

* * * * *